(12) United States Patent
Hui

(10) Patent No.: US 9,107,267 B2
(45) Date of Patent: Aug. 11, 2015

(54) METHOD AND NUMERICAL TOOL FOR OPTIMIZING LIGHT EMITTING DIODE SYSTEMS

(75) Inventor: Shu Yuen Ron Hui, Shatin (HK)

(73) Assignee: City University of Hong Kong, Kowloon (HK)

(*) Notice: Subject to any disclaimer, the term of this patent is extended or adjusted under 35 U.S.C. 154(b) by 978 days.

(21) Appl. No.: 13/145,028

(22) PCT Filed: Feb. 12, 2010

(86) PCT No.: PCT/IB2010/000272
§ 371 (c)(1),
(2), (4) Date: Oct. 7, 2011

(87) PCT Pub. No.: WO2010/092465
PCT Pub. Date: Aug. 19, 2010

(65) Prior Publication Data
US 2012/0020075 A1    Jan. 26, 2012

Related U.S. Application Data

(63) Continuation-in-part of application No. 12/370,101, filed on Feb. 12, 2009, now Pat. No. 8,086,434.

(51) Int. Cl.
*G06F 17/50* (2006.01)
*H05B 33/08* (2006.01)
(Continued)

(52) U.S. Cl.
CPC .......... *H05B 33/0854* (2013.01); *H01L 33/005* (2013.01); *H05B 33/0803* (2013.01);
(Continued)

(58) Field of Classification Search
CPC ...... G06G 7/62; F21V 33/00; H05B 33/0854; H05B 33/0803; H01L 33/005; H01L 2924/0002; H01L 25/0753; H01L 33/642; H01L 2933/0075; Y10S 362/80
USPC .......................................................... 703/18
See application file for complete search history.

(56) References Cited

U.S. PATENT DOCUMENTS 5,446,676 A * 8/1995 Huang et al. .................... 703/19
7,093,211 B1 * 8/2006 Downey et al. ............... 716/106
(Continued)

FOREIGN PATENT DOCUMENTS

CN    2710159 Y    7/2005
CN    2932076 Y    8/2007
(Continued)

OTHER PUBLICATIONS

Peter, B. "Compact Modeling of Electrical, Thermal and Optical LED Behavior" Proceedings of ESSDERC 2005 35$^{th}$ European Solid-State Device Research Conference, 205, pp. 145-148, ISBN 0-7803-9203-5.
(Continued)

*Primary Examiner* — Dwin M Craig
(74) *Attorney, Agent, or Firm* — Miller, Matthias & Hull LLP

(57) ABSTRACT

Methods and numerical tools for designing and optimizing LED systems are provided to achieve a desired luminous performance and to increase reliability and operating lifetime. In addition, methods for designing LED illumination systems are also disclosed to determine an optimum operating power for a desired output luminous flux, given the condition of the rated power of the LED and the heatsink. By the invention, LED illumination systems can be designed with a suitable choice of LED and/or heatsink.

16 Claims, 20 Drawing Sheets

(51) Int. Cl.
   *H01L 33/00* (2010.01)
   *H01L 25/075* (2006.01)
   *H01L 33/64* (2010.01)

(52) U.S. Cl.
   CPC .......... *H01L25/0753* (2013.01); *H01L 33/642* (2013.01); *H01L 2924/0002* (2013.01); *H01L 2933/0075* (2013.01); *Y10S 362/80* (2013.01)

(56) References Cited

U.S. PATENT DOCUMENTS

| | | | | |
|---|---|---|---|---|
| 2002/0185980 | A1* | 12/2002 | Beij et al. .................. | 315/169.1 |
| 2006/0066260 | A1* | 3/2006 | Maruyama .................. | 315/291 |
| 2008/0007182 | A1* | 1/2008 | Deurenberg et al. ......... | 315/149 |

FOREIGN PATENT DOCUMENTS

| EP | 1227706 A2 | 7/2002 |
|---|---|---|
| WO | WO2005/022952 A2 | 3/2005 |

OTHER PUBLICATIONS

Chun, K. L. et al. "High efficiency silicon-based high Power LED package integrated with micro-thermoelectric device" Proceedings of Technical Papers 2007 International Microsystems, Packaging, Assembly and Circuits Technology conference, 2007, pp. 10-13, ISBN 978-1-4244-1637-0.

Hui, S. Y. R. "A General Photo-Electro-Thermal Theory for Light Emitting Diodes (LED) Systems" IEEE Transactions on Power Electronics, Aug. 12, 2009, pp. 1967-1976, ISSN 0885-8993.

International Search Agent and Written Opinion issued in related PCT Application No. PCT/IB2010/000272; report dated Jun. 24, 2010.

* cited by examiner

Per unit LED Power based on rated power

METHOD AND NUMERICAL TOOL FOR OPTIMIZING LIGHT EMITTING DIODE SYSTEMS

CROSS-REFERENCE TO RELATED APPLICATIONS

This application is a U.S. national stage filing of International Patent Application No. PCT/IB2010/000272 filed on Feb. 12, 2010, which is a continuation-in-part of U.S. patent application Ser. No. 12/370,101, filed on Feb. 12, 2009, and which issued as U.S. Pat. No. 8,086,434 on Dec. 27, 2011.

FIELD OF THE DISCLOSURE

This invention relates to methods and numerical tools for forming, and optimizing the performance of, light emitting diode (LED) systems having single or multiple LEDs so that the luminous flux output from a given thermal design of the LED systems is maximized.

BACKGROUND OF THE DISCLOSURE

A light emitting diode (LED) is a semiconductor device that emits light when a current is passed through it in a forward direction. Many types of LEDs are known that emit light in various wavelengths including infra-red, visible and ultra-violet regions. Many applications for LEDs are known including as indicator lights of various colours, for use in advertising displays, and in video displays.

In the past LEDs have tended to be lower power devices that produce relatively low power outputs and have not been used for general illumination purposes. More recently, however, high-power LED devices have become known that can provide an alternative to incandescent and fluorescent light sources. LED devices produce more light per watt than incandescent light sources and may therefore be useful as energy efficient light sources, while they have a number of advantages over fluorescent light sources including being easier to dim and not requiring the use of potentially toxic and polluting elements such as mercury to create the plasma that is the source of fluorescent light.

Light emitting diodes (LEDs) have therefore emerged as promising lighting devices for the future. However, LEDs are still primarily restricted to decorative, display and signaling applications so far and have not yet entered the market for general illumination to any great extent.

In photometry, one important factor that is commonly used for comparing different lighting devices is the luminous efficacy (lumen per Watt). One major hindrance to the widespread use of LEDs in general illumination applications is that the luminous flux of LEDs decreases with the junction temperature of the LEDs. The luminous efficacy of various LEDs typically decreases by approximately 0.2% to 1% per degree Celsius rise in temperature. Due to the ageing effect, the actual degradation of luminous efficacy could be higher than this quoted figures. Accelerated aging tests show that the light output can drop by a further 45%. For aged LEDs, the efficacy degradation rate could be up to 1% per ° C. In some applications such as automobile headlights and compact lamps, the ambient temperature could be very high and the size of the heatsink is limited. The drop in luminous efficacy due to thermal problem would be serious, resulting in reduction of luminous output.

In a recent article on lighting titled "Let there be light" (Harris, Mark, IET Engineering & Technology (E&T) Magazine, Vol. 4, Issue 20, 21 Nov.-4 Dec. 2009, pp. 18-21), it was commented that, in respect of LED products, "the majority of LED A-type replacement lamps do not meet manufacturer performance claims" and that "testing reveals that these lamps produce only 10 to 60 percent of their claimed light output". Besides the quality issues, one possible reason for such mismatch in the claimed and actual luminous performance is the understanding of the luminous efficacy figures of LED devices. LED device manufacturers usually cite high luminous efficacy figures which are only correct at a junction temperature of 25° C. In practice, luminous efficacy will decrease significantly with increasing LED junction temperature. At a junction temperature under normal operation, it is not unusual that the luminous efficacy could drop by 25% or more.

FIG. 1 shows a conventional LED. At the heart of the LED device is a light emitting semiconductor material such as InGaN though other materials will be known to those skilled in the art. In the example of FIG. 1 a light-emitting InGaN chip 1 is mounted on a silicon substrate 2 and is connected to electrodes such as cathode 3 through gold wires 4 and solder connection 5. The light-emitting chip 1 is covered by a silicone encapsulant 6 and a plastic lens 7.

When a LED of the type shown in FIG. 1 is used to generate light a substantial amount of heat is generated that will damage the light-emitting chip if not removed. Therefore a heat sink must be provided and beneath the light-emitting chip 1 is a heatsink slug 2. In practice when used to provide a source of light for illumination, conventionally multiple LEDs are provided to form a LED system as shown in FIG. 2 where multiple LEDs 10 are provided on a single heatsink 11.

SUMMARY OF THE DISCLOSURE

The present invention provides, in a first aspect, a method of forming or optimizing an LED system to achieve a desired luminous performance over a time period, the LED system comprising a single or a plurality of LEDs on a heatsink with each LED having a junction, the method comprising the steps of: (a) calculating a predicted luminous performance over the time period with a computer-implemented dynamic model; and (b) modifying the LED system such that the predicted luminous performance substantially matches the desired luminous performance.

In a second aspect, the present invention provides a method of optimizing an LED system comprising a single or a plurality of LEDs on a heatsink with each LED having a junction, the method comprising the step of calculating junction temperature over a time period with a computer-implemented dynamic model, thereby allowing modification of the LED system if a calculated peak junction temperature exceeds a maximum rated junction temperature, and thereby optimizing the LED system.

In both the first and second aspects above, the computer-implemented dynamic model, in one embodiment, is in the form of a software tool on a computer accessible through an internet website. In another embodiment, the computer-implemented dynamic model is in the form of a software tool stored on a portable computer-readable medium.

The present invention also provides, in a third aspect, a computer-implemented numerical tool that calculates a predicted luminous performance over a time period for an LED system comprising a single or a plurality of LEDs on a heatsink with each LED having a junction, thereby allowing modification of the LED system such that the predicted luminous performance substantially matches a desired luminous performance in order to form or optimize the LED system to achieve the desired luminous performance.

In a fourth aspect, the present invention provides a computer-implemented numerical tool for use with an LED system comprising a single or a plurality of LEDs on a heatsink with each LED having a junction, the computer-implemented numerical tool calculating junction temperature over a time period, thereby allowing modification of the LED system if a calculated peak junction temperature exceeds a maximum rated junction temperature, and thereby optimizing the LED system.

In both the third and fourth aspects above, the computer-implemented numerical tool, in one embodiment, is in the form of a software tool on a computer accessible through an internet website. In another embodiment, the computer-implemented numerical tool is in the form of a software tool stored on a portable computer-readable medium.

Preferably, in both the first and third aspects above, luminous performance is one or more of luminous flux of the LED system, luminous efficacy of the LED system, heatsink temperature and junction temperature over the time period.

In a fifth aspect, the present invention provides a method of forming an LED illumination system comprising a single or a plurality of LEDs on a heatsink with a desired output flux, comprising the steps of: (a) modeling on a computer the luminous flux emitted by said LED system as a function of the thermal resistance of said heatsink and the power applied to each LED, and (b) selecting an LED system such that the maximum luminous flux is emitted at a power equal to or below a rated power of said LED system provided that said maximum luminous flux is equal to or greater than the desired output flux, or (c) selecting an LED such that the rated power of said LED system is below the power at which the maximum luminous flux is emitted, provided that the flux emitted by said LED system at said rated power is equal to or greater than the desired output flux.

Preferably, in option (c) the rated power is at between 80% and 96% of the power at which maximum flux would be output.

In a sixth aspect, the present invention provides a method of forming an LED illumination system comprising a single or a plurality of LEDs on a heatsink with a desired output flux, comprising the steps of: (a) modeling on a computer the luminous flux emitted by said LED system as a function of the thermal resistance of said heatsink and the power applied to each LED, and (b) selecting a heatsink having a thermal resistance such that the maximum luminous flux is emitted at a power equal to or below a rated power of said LEDs, or (c) selecting a heatsink having a thermal resistance such that the rated power of said LED system is below the power at which the maximum luminous flux is emitted, provided that the flux emitted by said LED system at said rated power is equal to or greater than the desired output flux.

Preferably in step (c) the rated power is at between 80% and 96% of the power at which maximum flux would be output.

In a seventh aspect, the present invention provides an LED illumination system comprising a plurality of LEDs on a heatsink, wherein said heatsink has a thermal resistance such that the maximum luminous flux is emitted at a power below a rated power of said LEDs.

The present invention also provides, in an eighth aspect, a method of forming an LED illumination system comprising a plurality of LEDs on a heatsink with a desired output flux, comprising the steps of: (a) selecting an LED system such that the maximum luminous flux is emitted at a power below a rated power of said LED system provided that said maximum luminous flux is equal to or greater than the desired output flux, or (b) selecting an LED such that the rated power of said LED system is below the power at which the maximum luminous flux is emitted, provided that the flux emitted by said LED system at said rated power is equal to or greater than the desired output flux.

In a ninth aspect, the present invention provides a method of forming an LED illumination system comprising a plurality of LEDs on a heatsink with a desired output flux, comprising the steps of: (a) selecting a heatsink having a thermal resistance such that the maximum luminous flux is emitted at a power below a rated power of said LEDs, or (b) selecting a heatsink having a thermal resistance such that the rated power of said LED system is below the power at which the maximum luminous flux is emitted, provided that the flux emitted by said LED system at said rated power is equal to or greater than the desired output flux.

BRIEF DESCRIPTION OF THE DRAWINGS

Some embodiments of the present invention will now be described by way of example and with reference to the accompanying drawings, in which:—

DETAILED DESCRIPTION OF THE DISCLOSURE

To increase the light emitted from a conventional LED system it is necessary to increase the current applied to the LED. Continuing to increase the LED power will have diminishing returns, however, as the increasing temperature of the LED will reduce its efficiency and potentially damage the LED. The heatsink is therefore important as it is essential for heat to be carried away from the LED so as not to cause it any damage. The light emitted by a LED will increase with applied current provided that the heat produced can be removed, but for any individual LED design there will come a point where increasing power applied to the LED will not result in greater light being emitted because heat is no longer being effectively removed. Identifying the relationship between power applied and light emitted is an important aspect of the present invention.

The following is a photo-electro-thermal (PET) theory that characterizes this relationship.

Let $\phi_v$ be the total luminous flux of an LED system consisting of N LED devices.

$$\phi_v = N \times E \times P_d \tag{1}$$

where E is efficacy (lumen/Watt) and $P_d$ is the real power of one LED (W)

Figure 1:
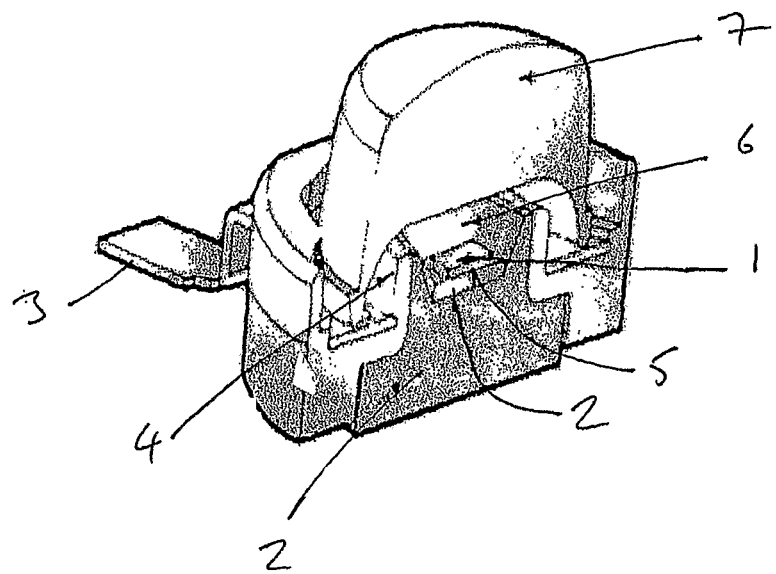
FIG. 1 shows schematically the structure of a conventional LED.
Figure 2:
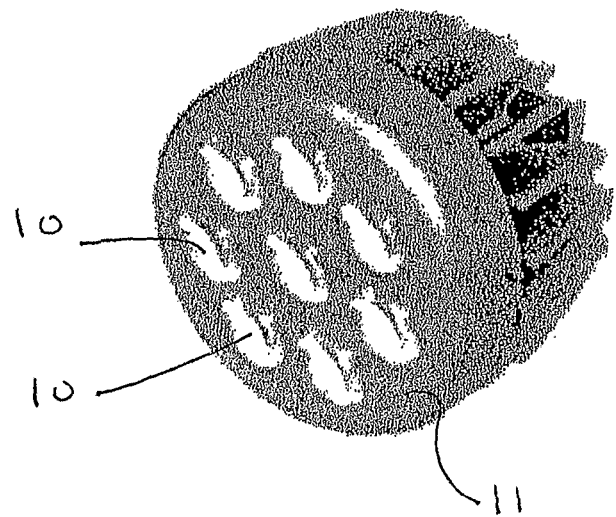
FIG. 2 shows a conventional system with multiple individual LEDs mounted on a single heatsink.
Figure 3:
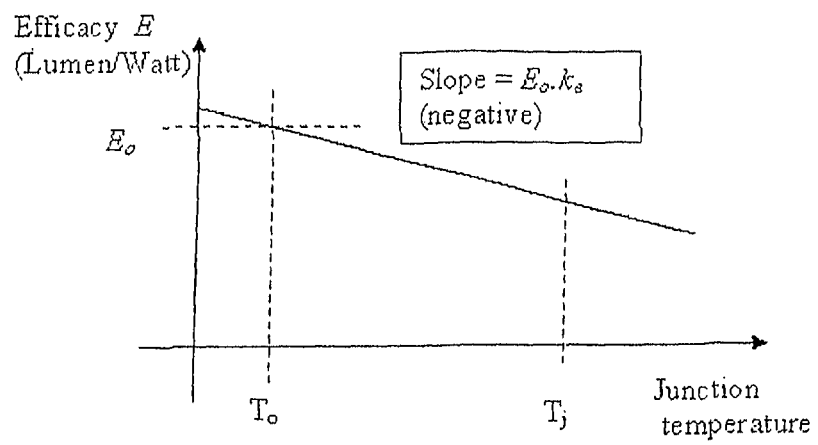
FIG. 3 is a plot of the typical relationship between efficacy of LEDs versus junction temperature.

It is well known that the efficacy (E) of LEDs will decrease with increasing junction temperature of the LEDs. FIG. 3 shows a typical relationship provided by an LED manufacturer. It can be seen that:

$$E = E_o \lfloor 1 + k_e(T_j - T_o) \rfloor \text{ for } T_j \geq T_o \text{ and } E \geq 0 \tag{2}$$

where $E_o$, is the rated efficacy at the rated temperature $T_o$ (typically 25° C.) and $k_e$ is the relative reduction of efficacy with increase in temperature. For example, if E reduces by 20% over a temperature increase of 100° C., then $k_e$=−0.002.

In general, the LED power can be defined as $P_d = V_d \times I_d$, where $V_d$ and $I_d$ are the diode voltage and current respectively. But only part of the power will be dissipated as heat. Thus, the heat generated in one LED is defined as:

$$P_{heat} = k_h P_d = k_h V_d I_d \tag{3}$$

where $k_h$ is a constant less than 1.

Figure 4:
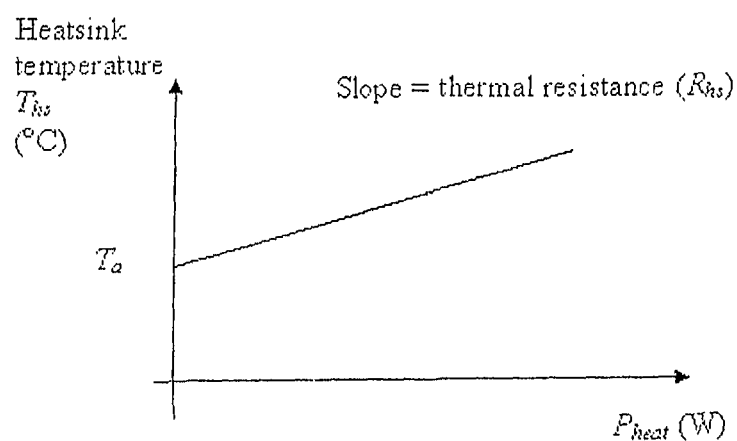
FIG. 4 is a plot of the typical relationship between heatsink temperature and power dissipation.
Figure 5A:
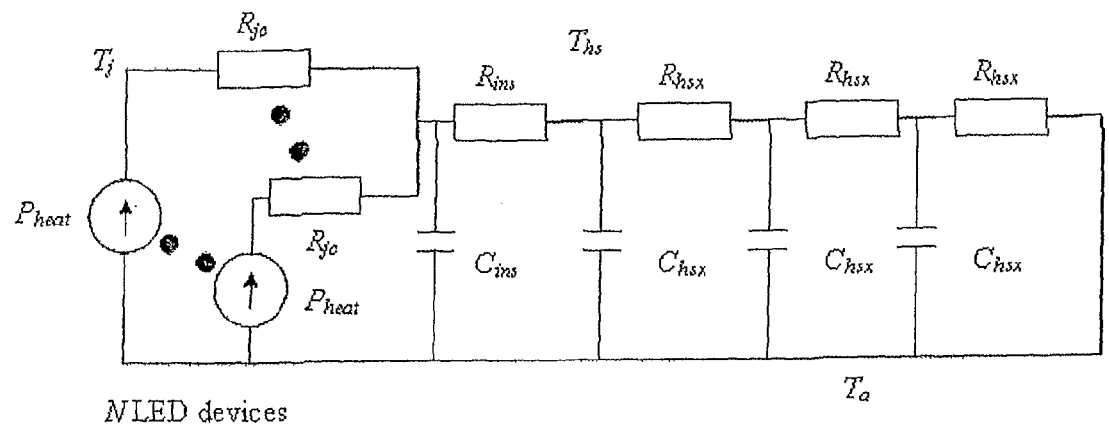
FIGS. 5(a) and (b) show (a) simplified dynamic thermal equivalent circuit of N LEDs mounted on the same heatsink, and (b) a simplified steady-state thermal equivalent circuit with N LEDs mounted on the same heatsink.

Now consider a typical relationship of the heatsink temperature and the heat generated in the LED system as shown in FIG. 4. A simplified dynamic thermal equivalent circuit of a LED system is shown in FIG. 5(a), assuming that (i) the N LEDs are placed on the same heatsink with thermal resistance of $R_{hs}$, (ii) each LED has a junction to case thermal resistance $R_{jc}$ and (iii) a thermal conductor with electrical isolation (such as heatsink compound) is used to isolate the LEDs from the heatsink and which has a thermal resistance of $R_{ins}$. A distributed thermal model is used for the heatsink due to its relatively large size. The corresponding thermal capacitances are needed if dynamic response is to be studied.

Figure 5B:
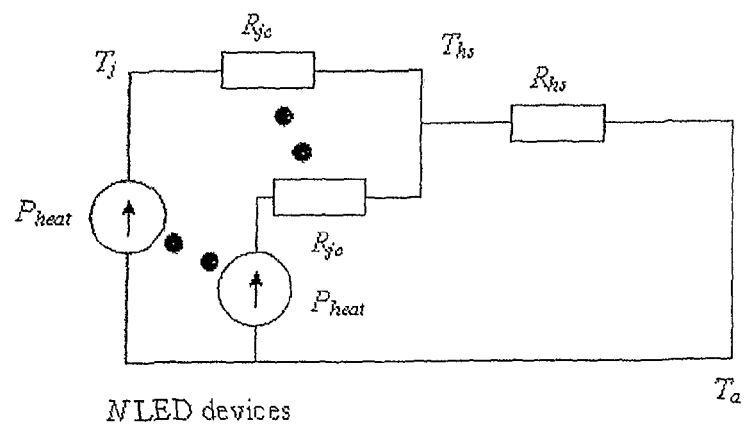

Under steady-state conditions, the thermal model can be further simplified into a steady-state model as shown in FIG. 5(b). In practice, a heat sink compound or equivalent may be used between the LEDs and the heat sink to ensure good thermal contact. The thermal resistance of such thermal conductor/electric insulator is relatively small when compared with $R_{jc}$ of LEDs and is neglected in FIG. 5(b) and the following equations.

Based on the model in FIG. 5(b), the steady-state heatsink temperature can be expressed as:

$$T_{hs} = T_a + R_{hs}(NP_{heat}) = T_a + R_{hs}(Nk_h P_d) \tag{4}$$

where $T_a$=ambient temperature.

From FIG. 5(b) and (4), the junction of each LED is therefore:

$$T_j = T_{hs} + R_{jc}(P_{heat}) = T_{hs} + R_{jc}(k_h P_d) \tag{5a}$$

$$T_j = T_a + (R_{jc} + NR_{hs})k_h P_d \tag{5b}$$

Now, $T_j$ obtained in (5) can be used in (2):

$$E = E_o \lfloor 1 + k_e(T_j - T_o) \rfloor$$

$$E = E_o \{1 + k_e[T_a + (R_{jc} + NR_{hs})k_h P_d - T_o]\}$$

$$E = E_o \lfloor 1 + k_e(T_a - T_o) + k_e k_h(R_{jc} + NR_{hs})P_d \rfloor \tag{6}$$

So, the total luminous flux $\phi_v$ is:

$$\phi_v = NEP_d$$

$$\phi_v = N\{E_o \lfloor 1 + k_e(T_a - T_o) + k_e k_h(R_{jc} + NR_{hs})P_d \rfloor\}P_d$$

$$\phi_v = NE_o\{[1 + k_e(T_a - T_o)]P_d + k_e k_h(R_{jc} + NR_{hs})P_d^2\} \tag{7a}$$

Equation (7a) can also be expressed as follows:

$$\phi_v = NE_o\{P_d + [k_e(T_a - T_o)]P_d + k_e k_h(R_{jc} + NR_{hs})P_d^2\} \tag{7b}$$

Several important observations can be made from equations (7a) and (7b).
1. Equation (7) relates the luminous flux ($\phi_v$) to the electrical power of the LED ($P_d$) and the thermal resistance of the heatsink ($R_{hs}$) and the LED junction ($R_{jc}$) together. It is an equation that integrates the photometric, electrical and thermal aspects of the LED system together.
2. For a given heatsink (that may be restricted in size by a specific application), the operating point $P_d^*$ at which maximum $\phi_v$ occurs can be determined. Alternatively where there is flexibility in designing the heatsink, the equations can be used for thermal design to optimize the size of the heatsink ($R_{hs}$) for a given LED array.
3. Because $k_e$ is negative and less than 1, (7) is in the form of $\phi_v = \alpha_1 P_d - \alpha_2 P_d^2$ where $a_1$ and $a_2$ are two positive coefficients. As $P_d$ is increased from zero, $\phi_v$ increases almost linearly because the second term is negligible when $P_d$ is small. As $P_d$ increases, the second negative term which is proportional to the square of $P_d$ will reduce $\phi_v$ significantly. After reaching the maximum point, the $\phi_v$ will drop faster as $P_d$ and $R_{jc}$ increase (due to the increasing significance of the negative terms in (7b)). This means that the parabola of $\phi_v$ is not symmetrical. Since the luminous flux function is a parabola and therefore has a maximum value, this maximum point can be obtained from $$\frac{d\phi_v}{dP_d} = 0.$$

By differentiating (7) with respect to $P_d$, $$\frac{d\phi_v}{dP_d} = NE_o\Big\{[1 + k_e(T_a - T_o)] + 2k_e k_h(R_{jc} + NR_{hs})P_d + [(T_a - T_o)P_d + k_h(R_{jc} + NR_{hs})P_d^2]\frac{dk_e}{dP_d} + [k_e(R_{jc} + NR_{hs})P_d^2]\frac{dk_h}{dP_d} + (k_e k_h P_d^2)\frac{dR_{jc}}{dP_d}\Big\} \quad (8)$$

It should be noted that the first two terms on the right hand side of (8) do not have derivatives, while the remaining three terms do. Strictly speaking, $k_e$, $k_h$ and $R_{jc}$ are not constant. It must be noted that $R_{jc}$ will indeed increase significantly with lamp power.
The above equations can usefully be simplified for practical applications. As a first approximation, it is assumed that $k_e$, $k_h$, and $R_{jc}$ are constant for the time being. It is known that $k_h$ will reduce slightly for a few percent under dimming conditions. From LED manufacturer data sheets the degradation of the efficacy with junction temperature is usually assumed to be linear and thus $k_e$ is assumed to be constant. This assumption is acceptable for $k_e$ and $k_h$, and will be relaxed to accommodate the changing nature of $R_{jc}$ in the analysis later. Based on this assumption, (8) can be simplified as:

$$\frac{d\phi_v}{dP_d} = NE_o\{[1 + k_e(T_a - T_o)] + 2[k_e k_h(R_{jc} + NR_{hs})]P_d\} \quad (9)$$

Therefore, maximum-$\phi_v$ point can be obtained by putting $$\frac{d\phi_v}{dP_d} = 0 \text{ and} \quad (10)$$

$$P_d^* = -\frac{[1 + k_e(T_a - T_o)]}{2k_e k_h(R_{jc} + NR_{hs})}$$

where $P_d^*$ is the LED power at which maximum $\phi_v$ occurs. (Note that $k_e$ is a negative value.)
From (3), the corresponding LED current at which maximum $\phi_v$ occurs can be obtained as:

$$I_d^* = -\frac{[1 + k_e(T_a - T_o)]}{2k_e k_h(R_{jc} + NR_{hs})V_d} \quad (11)$$

Several significant observations can be made from (10) and (11).
1. Equations (10) and (11) relate the optimal $P_d$ and $I_d$, respectively, to the thermal design of the LED system (i.e. thermal resistance of the heatsink $R_{hs}$ and $R_{jc}$.
2. The maximum luminous flux will occur approximately at a lamp power $P_d^*$ specified in (10). This $P_d^*$ will shift to a lower value if ($R_{jc} + NR_{hs}$) is increased. This leads to the possibility that the $P_d^*$ may occur at a power level that is less than the rated power $P_{d(rated)}$ of the LED.
3. Based on the above comment, one should expect that the $P_d^*$ could be shifted to higher power level if a larger heatsink with lower $R_{hs}$ is used.
4. For many applications such as head lamps of vehicles and compact lamps for replacement of incandescent lamps, the size of the heatsink is highly restricted and the ambient temperature is high. In these cases, there is a high possibility that $P_d^*$ (at which maximum luminous flux is produced) will occur at a power level less than the rated power.

In practice, $R_{jc}$ of the LED increases with lamp power. Therefore, a vigorous equation can be obtained from (8) as:

$$\frac{d\phi_v}{dP_d} = NE_o\Big\{[1 + k_e(T_a - T_o)] + 2k_e k_h(R_{jc} + NR_{hs})P_d + (k_e k_h P_d^2)\frac{dR_{jc}}{dP_d}\Big\} \quad (12)$$

Figure 6:
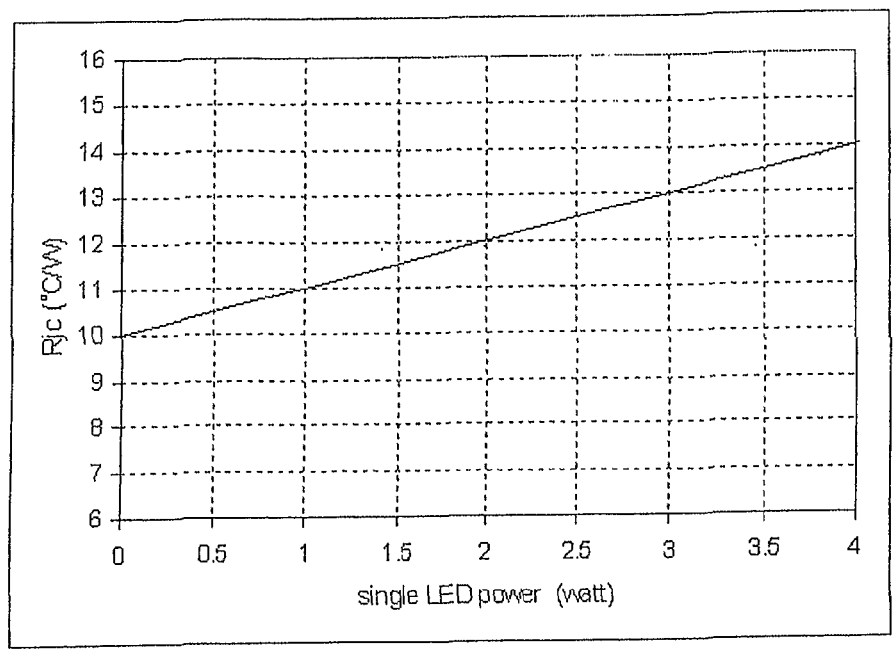
FIG. 6 shows an assumed linear function of junction-to-case thermal resistance $R_{jc}$.

The function of $R_{jc}$ is highly complex and it depends on several factors such as thermal resistance of the heatsink, ambient temperature, the LED size and mounting structure and even the orientation of the heatsink. Equation (7b) in fact provides the physical meaning of effects of the temperature-dependent $R_{jc}$. Since $R_{jc}$ increases with lamp power $P_d$, the two negative terms (with $k_e$ which is negative) in (7b) will accelerate the reduction of the luminous flux as $P_d$ increases. This effect should be noticeable when $P_d$ exceeds the $P_d^*$, resulting in a slightly asymmetric parabolic luminous flux function.
In order to verify the theory two types of LEDs are used: 3W cool white LEDs and 5W cool white LEDs from Luxeon K2 Star series. They are mounted on several heatsinks with thermal resistances of 6.3° C./W, 3.9° C./W and 2.2° C./W so that experiments can be performed to evaluate their luminous output under different lamp power operations.
Since the junction-to-case thermal resistance $R_{jc}$ is a complex and nonlinear function of the lamp heat dissipation $P_{heat}$ (which is equal to $k_h P_d$) and the thermal design of the mounting structure, the theoretical prediction is based on a simplified linear function as follows:

$$R_{jc} = R_{jco}(1 + k_{jc} P_d) \quad (13)$$

where $R_{jco}$ is the rated junction-to-case thermal resistance at 25° C. and $k_{jc}$ is a positive coefficient. A typical linear approximation of $R_{jc}$ is shown in FIG. 6.

If equation (13) is used in (7b), a more accurate luminous flux equation can be derived as:

$$\phi_v = NE_o\{[1 + k_e(T_a - T_o)]P_d + [k_e k_h(R_{jco} + NR_{hs})]P_d^{2+} [k_e k_h k_{jc} R_{jco}]P_d^3\} \quad (7c)$$

A: Tests on 3W LEDs
(i) On a Heatsink with Thermal Resistance of 6.3° C./W

A group of eight identical Luxeon K2 Cool-white 3W LEDs are mounted on a standard heatsink with a thermal resistance of 6.3° C./W. The efficacy of the LEDs is measured at rated power in an integrating sphere. The parameters required for the equation (7) are:
$k_e = -0.005$, $k_h = 0.85$, $T_a = 28°$ C., $T_0 = 25°$ C., $E_0 = 41$ Lumen/Watt, $N = 8$, $R_{hs} = 6.3°$ C./W, $R_{jco} = 10°$ C./W and $k_{jc} = 0.1°$ C./W$^2$.

Now two equations can be derived from (7). If the $R_{jc}$ is assumed to be constant as a first approximation (i.e. $R_{jc} = R_{jco}$)=

$$\phi_v = 323.08 \times P_d - 84.2 \times P_d^2 \quad (14)$$

If $R_{jc}$ is assumed to obey (13), $$\phi_v = 323.08 \times P_d - 84.2 \times P_d^2 - 1.39 P_d^3 \quad (15)$$

Figure 7:
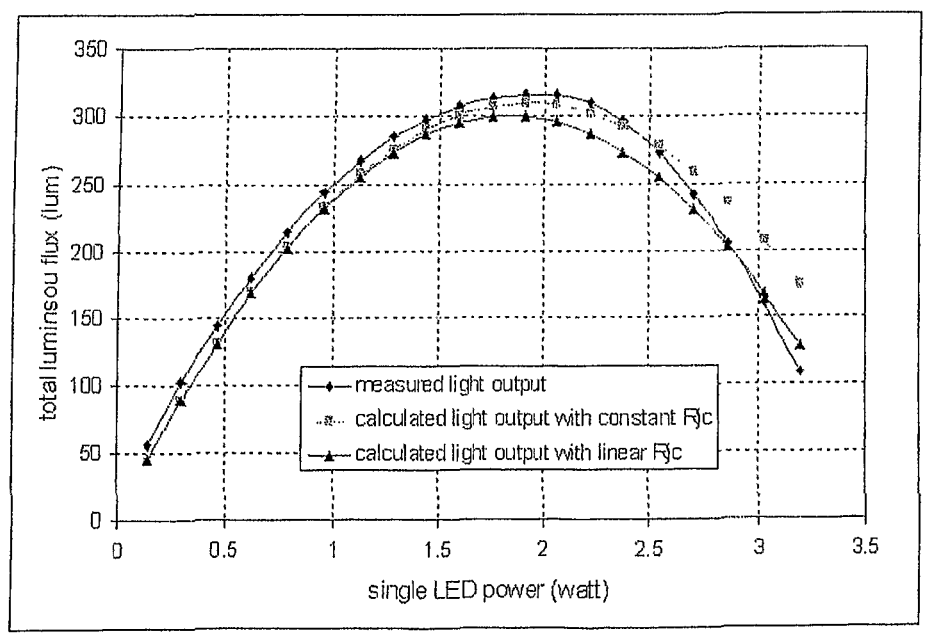
FIG. 7 shows calculated and measured total luminous flux versus lamp power for eight 3W LEDs mounted on a heatsink with thermal resistance of 6.3° C./W.
Figure 8:
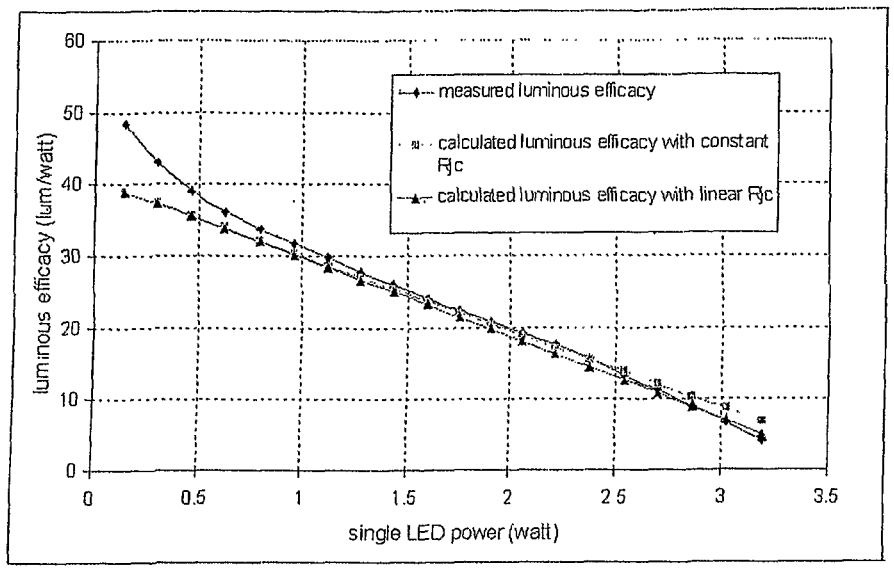
FIG. 8 shows calculated and measured total luminous efficacy versus lamp power for eight 3W LEDs mounted on a heatsink with thermal resistance of 6.3° C./W.

The luminous flux is measured in an integrating sphere. The measured total luminous flux for eight LEDs is used for comparison with calculated values. The measured and calculated total luminous flux values are plotted, not against the total power sum of eight LEDs but against one LED power because the eight LEDs are identical and are connected in series. Using the power of one LED in the x-axis allows one to check easily if the optimal operating point is at the rated LED power or not. The measured results and calculated results from (14) and (15) are plotted in FIG. 7. Several points should be noted:

1. The theoretical curves generally have the same trends as the measured curve. This confirms the validity of the general theory.
2. The maximum lumen/Watt point occurs at about $P_d = 1.9W$, which is less than the rated power of 3 W. This result shows that the general theory can predict accurately the $P_d^*$ operating point which may not be the rated power. Equation (10) indicates that a large $NR_{hs}$ term will shift $P_d^*$ to the low power level of the LED.
3. The two negative terms in this example can also be seen in (15). The asymmetry after the peak luminous output point is more noticeable in the theoretical curve obtained from (15) than from (14). Comparison of (14) and (15) shows that the effect of the variation of $R_{jc}$, which is reflected in the extra third term in (15) is the reason for the obvious asymmetry of $\phi_v$.
4. In summary, the simplified model (7b), which is the basis for (14), has the form of $\phi_v = \alpha_1 P_d - \alpha_2 P_d^2$, while the more vigorous model (7c), which is the basis for (15), has the form of $\phi_v = \alpha_1 P_d - \alpha_2 P_d^2 - \alpha_3 P_d^2$. Therefore, the model in (7c) is more accurate than the model (7b) particularly when $P_d$ has exceeded $P_d^*$. However, since both simplified and vigorous models are accurate enough for the power less than $P_d^*$, which is also the recommended useable power range of LEDs, both equations can be used in the design optimization procedure to be explained.

Based on (6), the efficacy function can also be obtained.

$$E = 40.39 - 10.52 P_d \text{ assuming } R_{jc} \text{ is constant} \quad (16)$$

$$E = 40.39 - 10.52 P_d - 0.17 P_d^2 \text{ assuming } R_{jc} \text{ obeys (13)} \quad (17)$$

The measured efficacy values and the calculated values from (16) and (17) are displayed in FIG. 6. It is noted that the calculated values are consistent with measurements. The results obtained from (17) are more accurate than those from (16) when $P_d$ is large.

(ii) On a Heatsink with Thermal Resistance of 4.5° C./W

Figure 9:
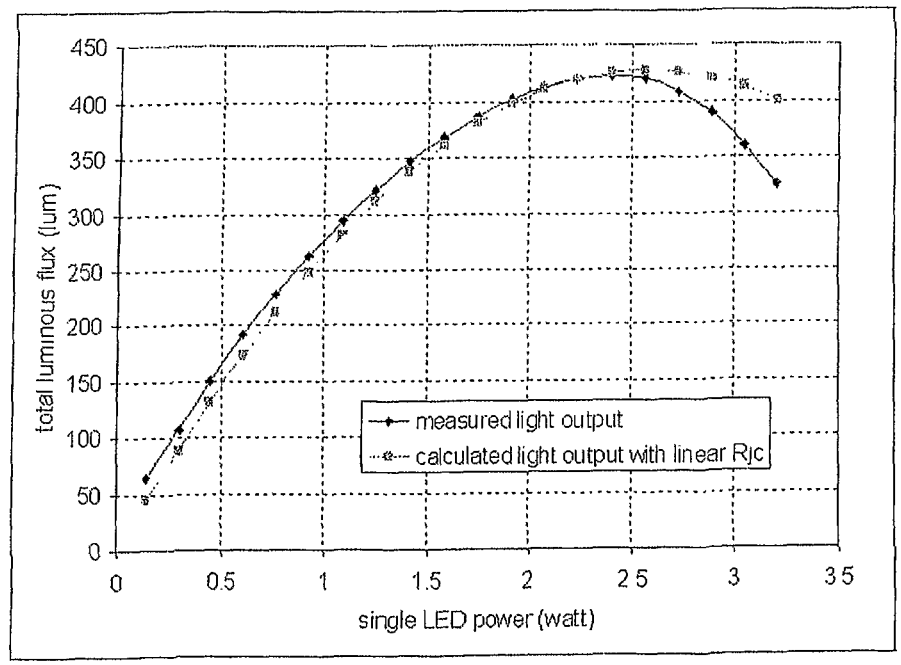
FIG. 9 shows calculated and measured total luminous flux versus lamp power for eight 3W LEDs mounted on a heatsink with thermal resistance of 4.5° C./W.

Eight identical 3W LEDs are mounted on a larger heatsink with thermal resistance of 4.5° C./W. The measured and calculated total luminous output as a function of single LED power $P_d$ are shown in FIG. 9. It is noted that the calculated values are generally consistent with measurements, except at very low power where the light output is low and the relative measurement error is large. The $P_d^*$ is 2.4W at an efficacy of 21 lumens/Watt in this case. The use of a larger heatsink with a smaller thermal resistance means that the $NR_{hs}$ term in the denominator of (10) is smaller than that in the previous case (with $R_{hs}$ 6.3° C./W). Therefore, $P_d^*$ has increased from 1.9W to 2.4W as expected from (10) and the efficacy from 21 lumens/Watt to 23 lumens/Watt.

Figure 10:
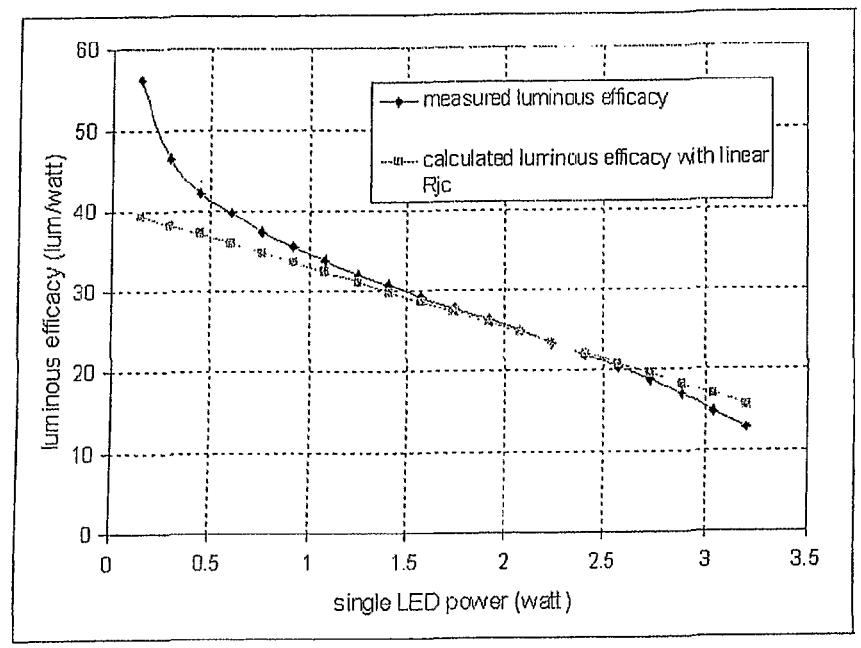
FIG. 10 shows calculated and measured total luminous efficacy versus lamp power for eight 3W LEDs mounted on a heatsink with thermal resistance of 4.5° C./W.

The corresponding measured and calculated efficacy are shown in FIG. 10 and it can be seen that they are in good agreement.

(iii) On a Heatsink with Thermal Resistance of 2.2° C./W

Figure 11:
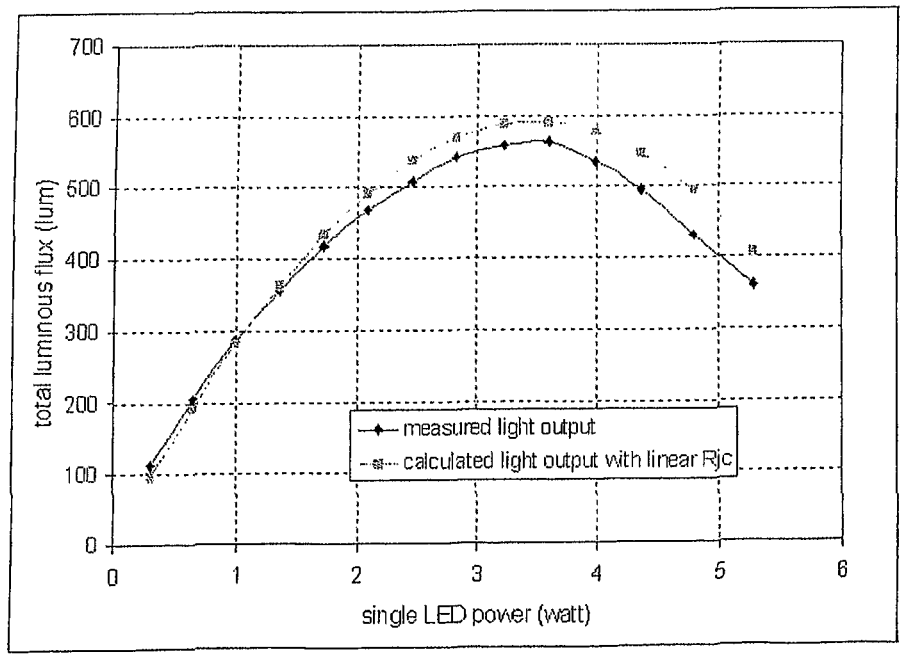
FIG. 11 shows calculated and measured total luminous flux versus lamp power for eight 3W LEDs mounted on heatsink with thermal resistance of 2.2° C./W.
Figure 12:
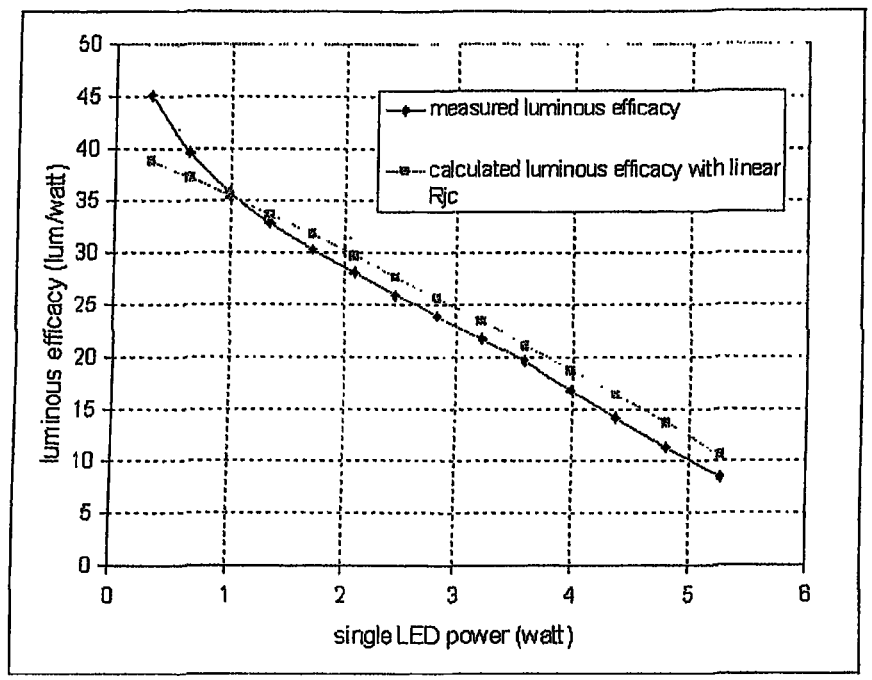
FIG. 12 shows calculated and measured total luminous efficacy versus lamp power for eight 3W LEDs mounted on a heatsink with thermal resistance of 2.2° C./W.

Another eight 3W LEDs are mounted on an even larger heatsink with thermal resistance of 2.2° C./W for evaluation. The measured and calculated luminous output as a function of LED power $P_d$ are shown in FIG. 11 and the corresponding results of the efficacy are included in FIG. 12.

The theoretical $P_d^*$ is now about 3.5W, which is higher than the rated power of 3 W. This again confirms the prediction by the theory (10) that $P_d^*$ will shift to the higher power level with a decreasing term of $NR_{hs}$ (i.e a larger heatsink with a lower $R_{hs}$). Therefore, the theory can be used to design the optimal heatsink for a particular operating power. On the other hand, it can also be used to predict the optimal operating power for a given heatsink.

B: Tests on 5W LEDs

Figure 13:
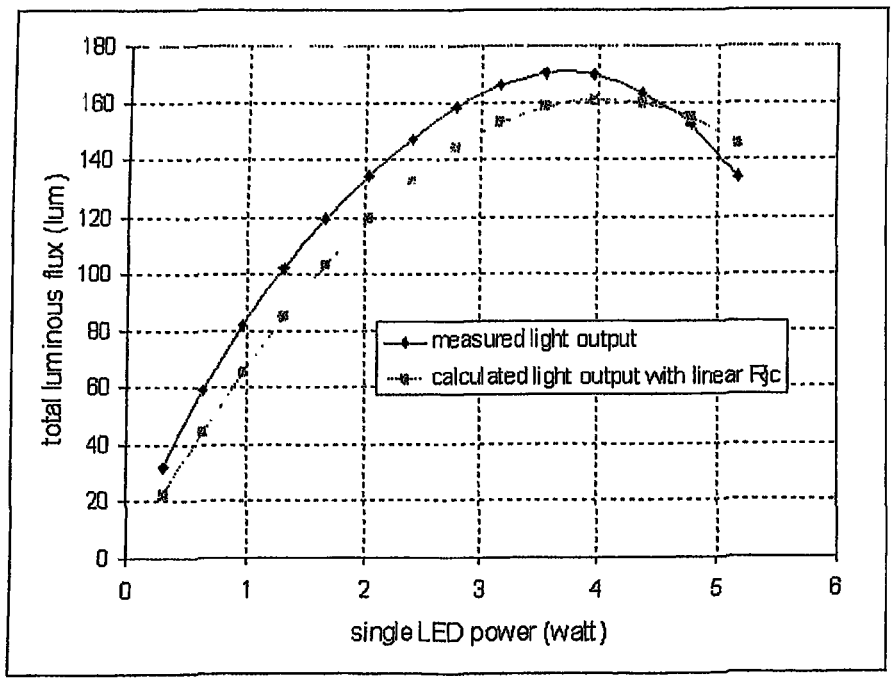
FIG. 13 shows calculated and measured total luminous flux versus lamp power for two 5W LEDs mounted on heatsink with thermal resistance of 10° C./W.
Figure 14:
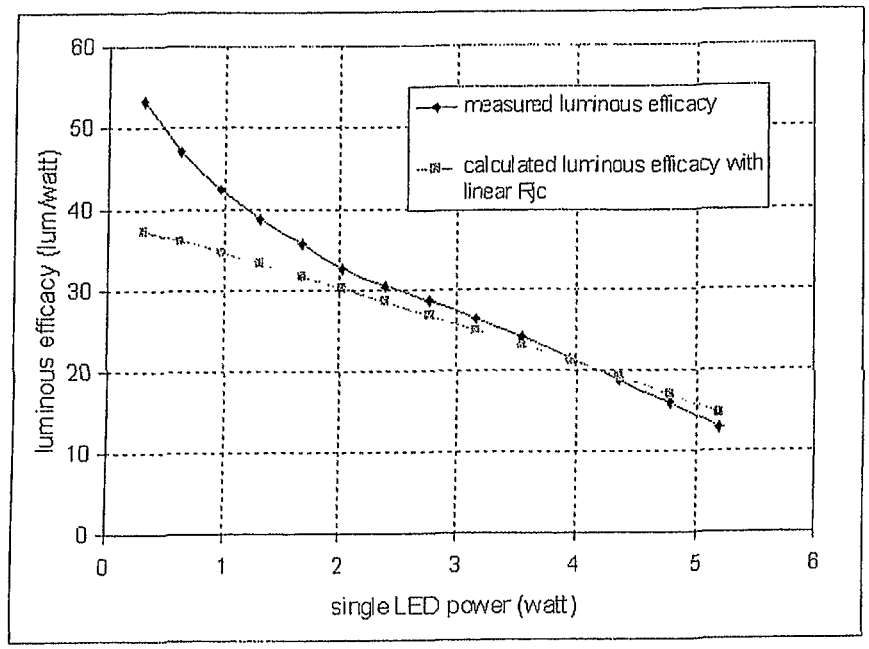
FIG. 14 shows calculated and measured total luminous efficacy versus lamp power for two 5W LEDs mounted on a heatsink with thermal resistance of 10° C./W.

In order to ensure that the theory can be applied to other LEDs, 5W LEDs are used for evaluation. They are mounted on two heatsinks with thermal resistance of 6.8° C./W and 10° C./W respectively (i) On a Heatsink with Thermal Resistance of 10° C./W Two 5W LEDs are mounted on a heatsink with thermal resistance of 10° C./W. For the theoretical calculation, the parameters used in (10) are $k_e = -0.00355$, $k_h = 0.85$, $T_a = 28°$ C., $T_0 = 25$, $E_0 = 38$ Lum/W, $N = 2$, $R_{hs} = 10°$ C./W, $R_{jc} = 13°$ C./W and $k_{jc} = 0.13°$ C./W$^2$. Fitting these parameters into (7) and assuming that $R_{jc}$ will rise linearly with temperature, the luminous flux equation and the efficacy equation are expressed as (18) and (19), respectively, and they are plotted with practical measurements in FIG. 13 and FIG. 14, respectively. Despite only two 5W LEDs being used, the theoretical predictions based on the averaged values are in general agreement with the measurements.

$$\phi_v = 75.2 P_d - 7.57 P_d^2 - 0.296 P_d^3 \quad (18)$$

$$E = 37.6 - 3.78 P_d - 0.149 P_d^2 \quad (19)$$

(ii) On a Heatsink with Thermal Resistance of 6.8° C./W

Figure 15:
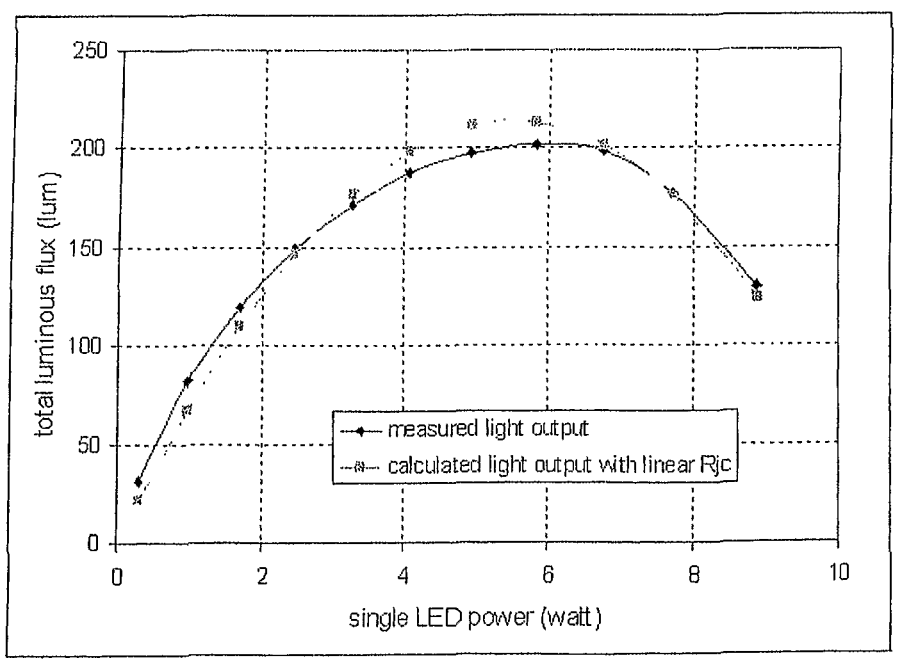
FIG. 15 shows calculated and measured total luminous flux versus lamp power for two 5W LEDs mounted on heatsink with thermal resistance of 6.8° C./W.
Figure 16:
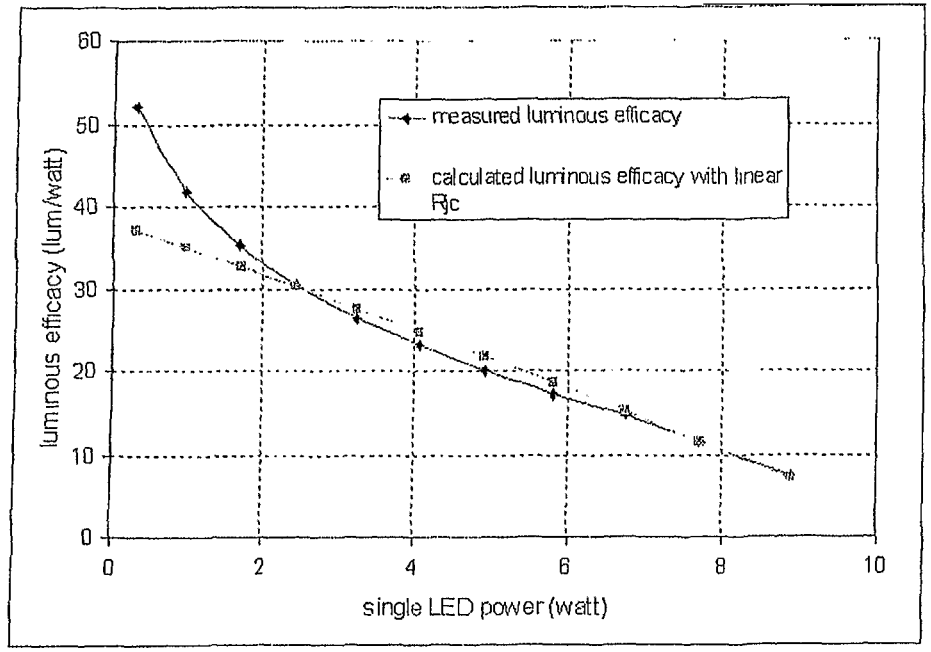
FIG. 16 shows calculated and measured total luminous efficacy versus lamp power for two 5W LEDs mounted on a heatsink with thermal resistance of 6.8° C./W.

The previous experiments are repeated by mounting the two 5W LEDs on a larger heatsink with a thermal resistance of 6.8° C./W. FIG. 15 and FIG. 16 show the comparisons of the measured and calculated luminous flux and efficacy, respectively. In general, calculated and measured results are in good agreement. Comparisons of the peak luminous flux in FIG. 13 and FIG. 14 confirm once again that using a larger heatsink (with lower thermal resistance) can shift the optimal operating point to a higher lamp power level. For the heatsink with $R_{hs}$=10° C./W, the optimal point occurs at about 3.8W. For the heatsink with $R_{hs}$=6.8° C./W, this optimal point has shifted to about 6W.

An important conclusion can be drawn from these results. The peak luminous flux (i.e. maximum $\phi_v$) occurs at a LED power $P_d^*$ that depends on the thermal design (i.e. the heatsink thermal resistance). In general, the larger the heatsink (the lower the heatsink thermal resistance or the better the cooling effects), the higher the peak luminous flux can be achieved. Since operating the LEDs at a power higher than their rated power will shorten the lifetime of LEDs drastically, the theory can be used to project the maximum luminous flux for a given thermal design. It can also be used to predict the optimal thermal design for maximum luminous flux output if the LEDs are designed to operate at rated power.

Figure 17:
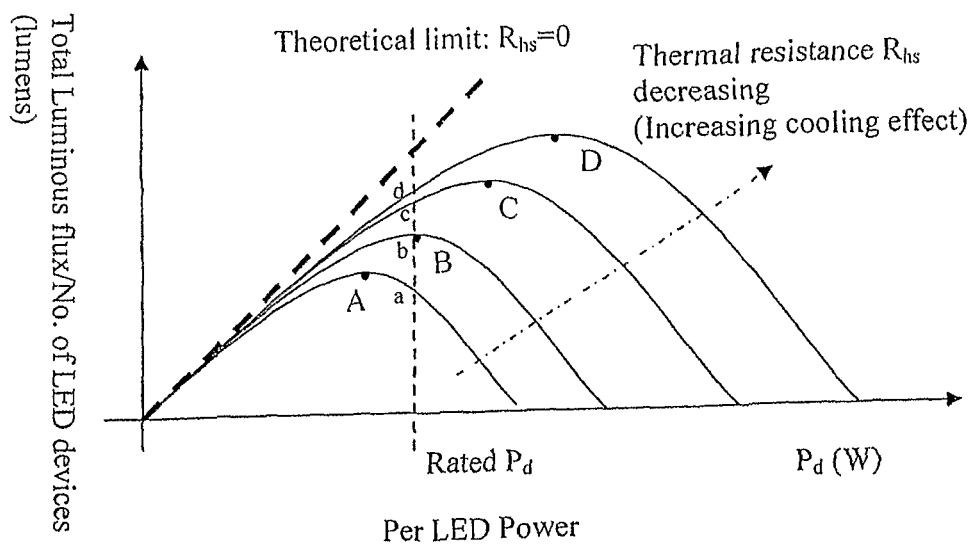
FIG. 17 plots total luminous flux emitted as a function of LED power.

$P_d^*$ can be controlled by using different heatsinks with different thermal resistance. For a larger heatsink, $R_{hs}$ becomes small and therefore $P_d^*$ will be shifted to the higher power level as shown in FIG. 17, where the values of $P_d^*$ are labeled as A, B, C and D as the size of heatsink (or cooling effect) increases. By assuming $R_{hs}$=0, a theoretical limit can be plotted as shown in FIG. 17. It is important to note that the operating LED power must not exceed the rated LED power ($P_{rated}$) otherwise the lifetime of the LED will be shortened. Therefore, the intersection points of these curves with the rated power limit indicate how the light output can be maximized.

It should be noted that a reduction of $R_{hs}$ corresponds to an increase in the cooling effect. One way to achieve increased cooling is to increase the size of the heatsink. In FIG. 17, it can be seen that two curves with maximum points marked by C and D have relatively high luminous flux at the rated power. The curve with maximum point D has a smaller $R_{hs}$ and thus a larger heatsink than that with maximum point C. The increase of luminous flux at the rated power from using curve C to curve D is small, but the increase in the size of the heatsink is much larger in proportion.

Three important points are highlighted here:
1. The maximum $\phi_v$ is the point of inflexion of the luminous flux function (7b) or (7c). As $P_d$ increases from zero, the positive slope of the curve $$\left(\text{i.e. } \frac{d\phi_v}{dP_d}\right)$$

is gradually decreasing to zero when the peak of the curve is reached. A large positive slope means that a relatively small increase of $P_d$ can result in a relatively large increase of $\phi_v$. So the initial linear portion of the curve results in good efficacy. As $P_d$ is moved to the region at and around $P_d^*$, the slope is zero or relatively small. Therefore, a relatively large increase in $P_d$ will give a relatively small increase in $\phi_v$.
2. The LED power $P_d$ must not exceed the rated LED power $P_{d(rated)}$. Otherwise, the lifetime of the LED will be shortened. Therefore, the intersection points of these curves with the rated power limit should indicate how the light output can be maximized. The intersection points of these curves and the rated power line are denoted as "a", "b", "c" and "d" as shown in FIG. 17.
3. The values of $\phi_v$ at "c" and "d" are higher than that at "b". But the curve with peak $\phi_v$ at D requires a much larger heatsink than that with peak $\phi_v$ at C. The difference of $\phi_v$ at "c" and "d" may not be significant enough to justify an increase in cost and size of the heatsink.

The following rules are proposed as an optimization.

Rule 1:

The function of the luminous flux $\phi_v$ versus LED power $P_d$ is a parabolic curve with a maximum point. The operating point $P_d$ should be chosen at or below the maximum point $P_d^*$. This means that for a given luminous flux output, the lower LED power should be chosen. Within this recommended power range, either (7) or (14) can provide sufficiently accurate predictions.

Rule 2:

If the thermal design is restricted by limited space for the heatsink so that the $P_d^*$ occurs at a power less than or equal to the rated power $P_{(rated)}$, then the LED system should be operated at $P_d^*$ for each LED device. [For example, points A and B are optimal operating points for the respective curves as their $P_d^*$ values do not exceed $P_{(rated)}$.]

Rule 3:

If the thermal design is flexible, then the LED system should be designed in such a way that (i) the theoretical maximum $\phi_v$ point (or $P_d^*$) occurs at a power higher than $P_{(rated)}$ of the LED and (ii) the intersection point of the theoretical $\phi_v$-$P_d$ curve and the rated power line should have a value of about 80% to 96% of the theoretical maximum $\phi_v$ value. The rated power should be chosen as the operating power for each LED.

Figure 18:
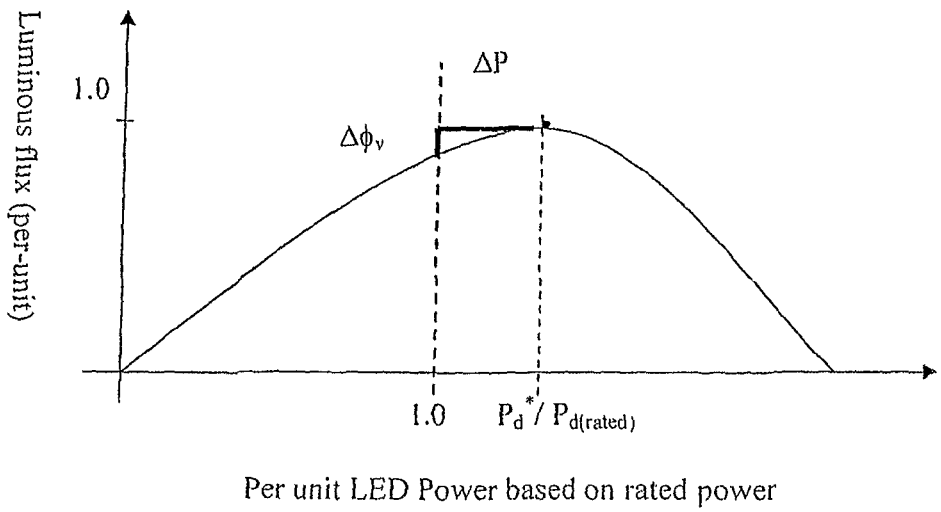
FIG. 18 illustrates in more detail one embodiment of the invention where an LED is operated below the peak value of emitted luminous flux.

Rule 3 is an important idea. Where the theoretical maximum ($P_d^*$ for maximum $\phi_v$) occurs at a point higher than the rated power, one should still operate the LED system at the rated power. As can be seen from FIGS. 17 and 18 the slope of the curve shows that as $P_d^*$ is approached the increase in luminous flux becomes very small and in terms of efficiency the gain in flux is not worth the additional power used. By using $\Delta\phi_v|_{p11}$=0.04~0.20 of the maximum $\phi_v$ point in the curve the 4%-20% range for $\Delta\phi_v$ from the maximum $\phi_v$ point offers a good compromise of the light output and the size and thus cost of the heatsink.

Figure 19:
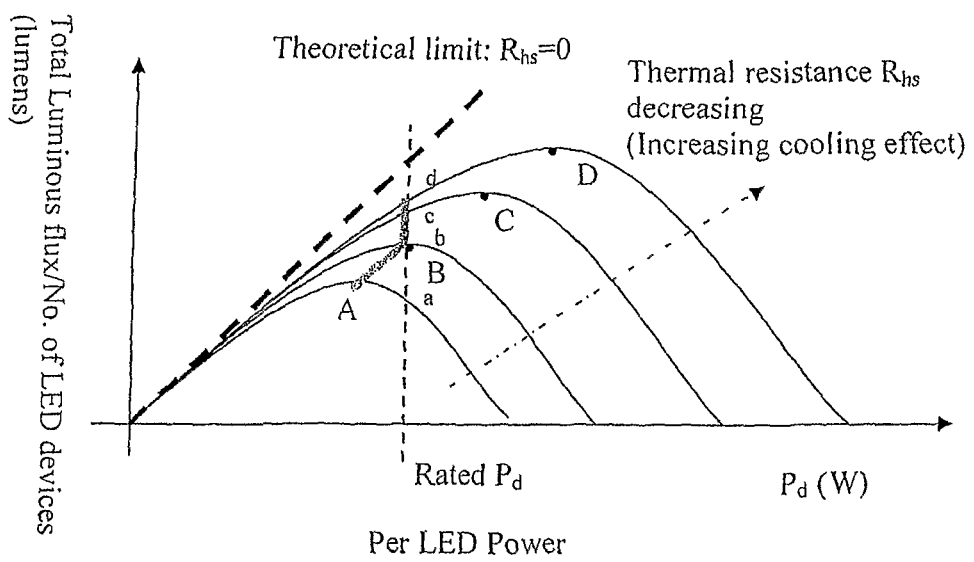
FIG. 19 illustrates the operating principles in the context of forced cooling.

If forced cooling is applied, the $\phi_v$-$P_d$ curve will change dynamically. This can be visualized as having a dynamically changing thermal resistance $R_{hs}$. The optimal operating point should follow the three rules explained previously. It should be kept along the operating lines as highlighted in the bold solid lines in FIG. 19 in order to maximize the luminous flux output.

Figure 20:
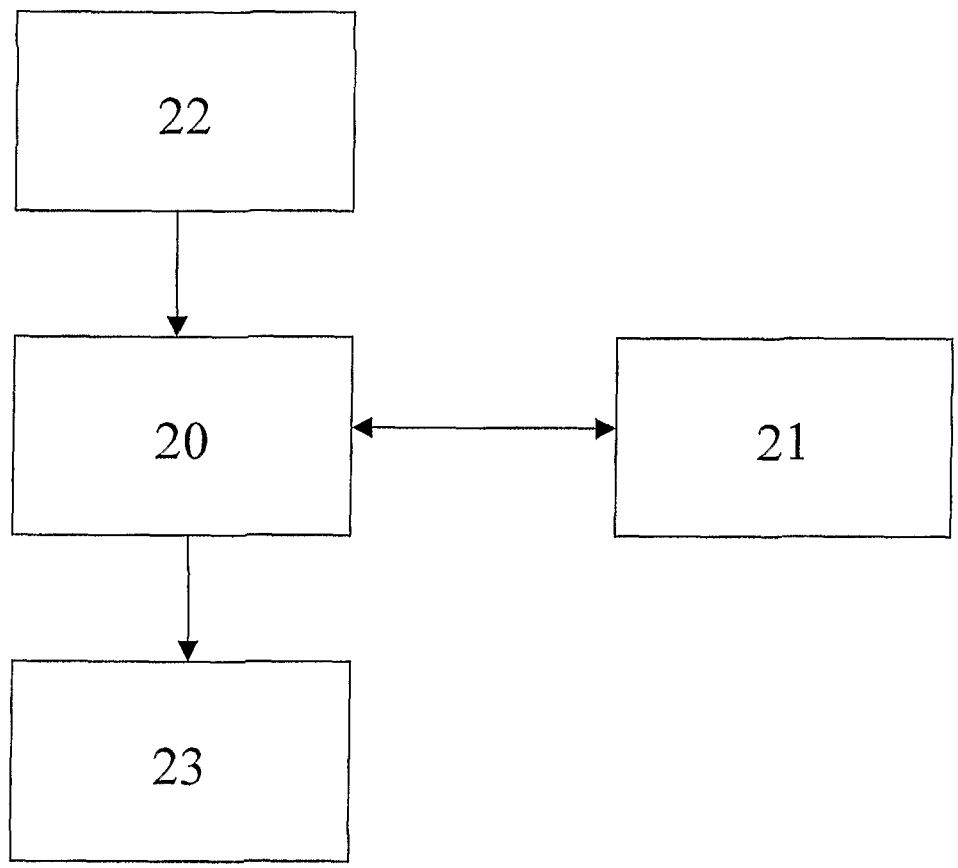
FIG. 20 shows an apparatus that may implement embodiments of the invention.

FIG. 20 shows schematically an apparatus that may be used in embodiments of the invention. The apparatus comprises a microprocessor control unit (MCU) 20 that performs functions to be described below, database 21, user input means 22 which may be a keyboard, touchscreen or any other means that enables a user to display data, and output display means 23 which may be a screen, print out or any other means for data output to be communicated to a user. Database 21 includes details obtained from datasheets of the physical and electrical parameters of all known commercially available LEDs. This database may be provided directly as part of the apparatus or may a database kept elsewhere and accessed remotely. A user will input selected parameters of a desired LED lighting system using input means 22. These parameters will include at least the desired luminous flux output required from the system, and may further include any other parameters that the user wishes to fix, including for example the number N of LEDs and the size of the heatsink if that is fixed.

Figure 21:
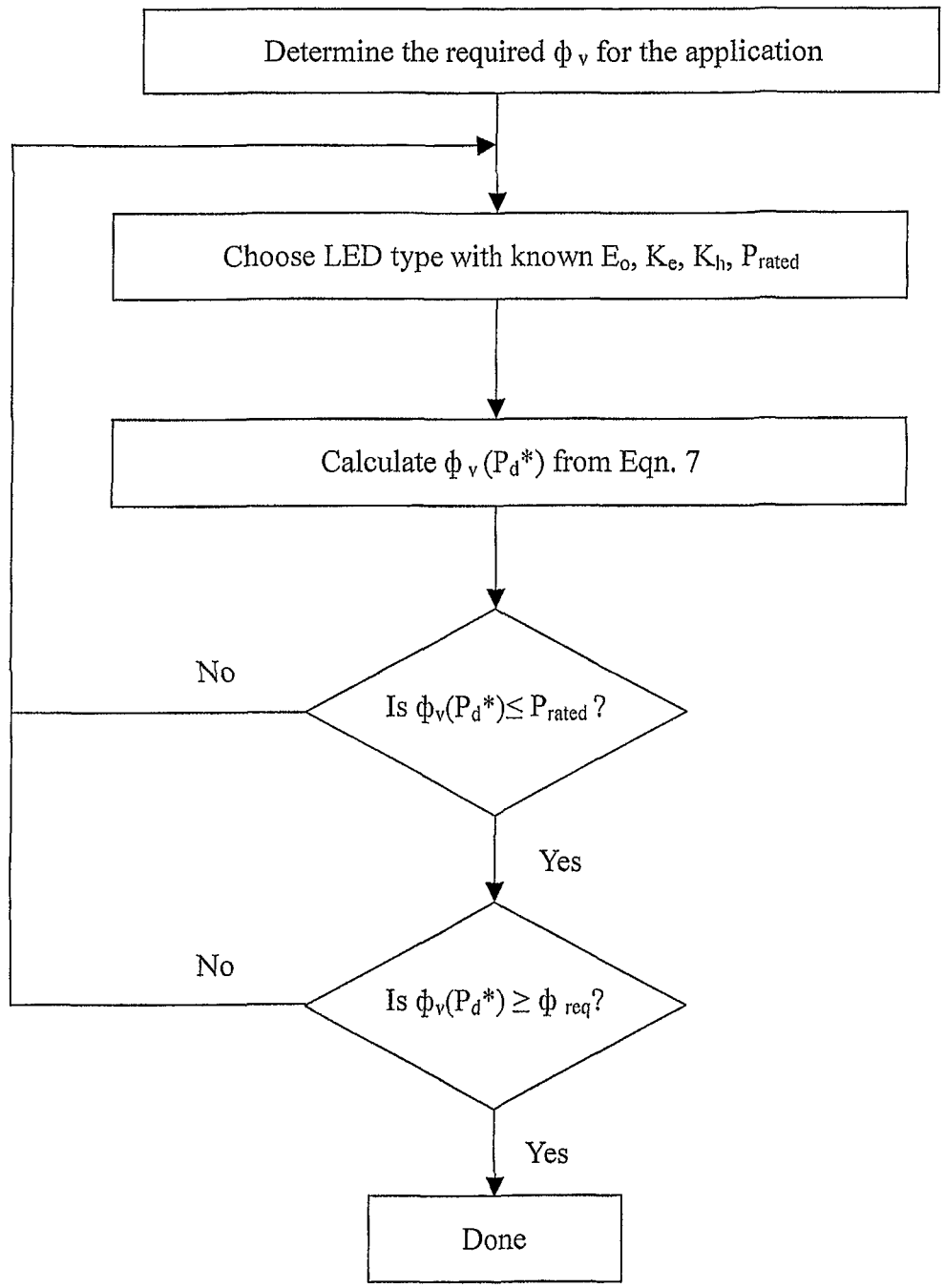
FIG. 21 shows a flowchart illustrating the use of an embodiment of the invention.
Figure 22:
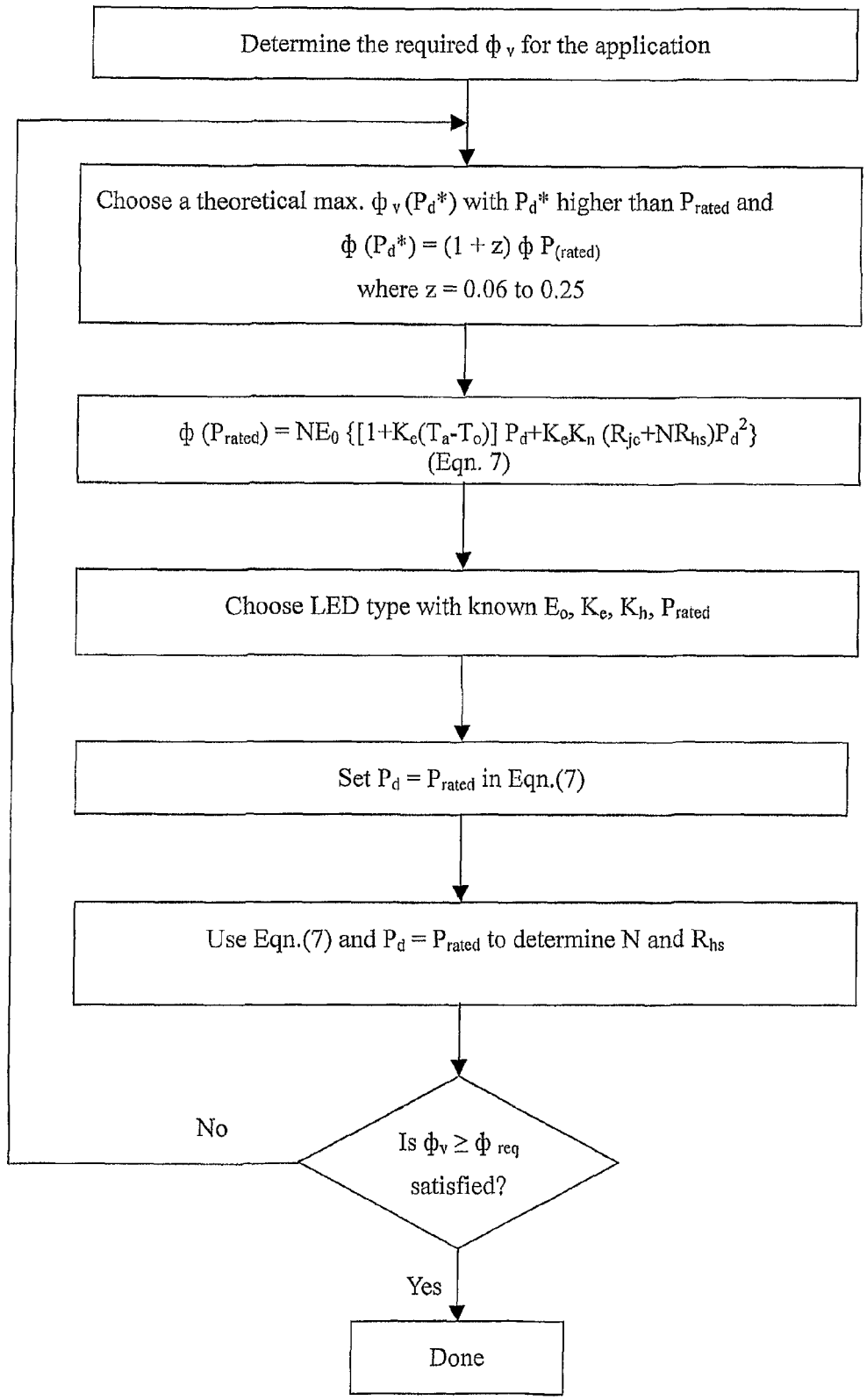
FIG. 22 shows a further flowchart illustrating the use of an embodiment of the invention.

MCU 20 is programmed to carry out the steps shown in the flowcharts of FIGS. 21 and 22. Beginning with FIG. 21, a user may input a required flux output $\phi_v$. The MCU may then select a candidate LED from the database and calculated the maximum flux that the LED is capable of achieving from Eq. 7 above. If this maximum flux is obtained at a power below the rated power, and if this maximum flux is equal to or greater than the required flux, then such an LED is capable of being used in an LED system meeting the desired flux output and the process can stop. If the answer to either question is negative, ie if the maximum flux would only be obtained at a power greater than the rated power, or if the maximum flux is insufficient, then another LED is chosen and the process repeats.

If no LED can be found by the process of FIG. 21, either after a number of attempts or after all LEDs in the database have been exhausted, the MCU runs the process of FIG. 22 (or alternatively a user may go directly to the process of FIG. 22 if preferred). This process corresponds to the situation where the peak of the flux output occurs at a power above the rated power. In such cases, as discussed above, it is preferable to select an LED with a peak flux output such that the maximum rated power is between 80% and 96% of the power at which the maximum flux is obtained. As can be seen from lines C and D in FIG. 17 the output of these lines where they cross the rated power is higher than the equivalent flux of an LED that has its peak flux output exactly when operated at the rated power (the condition of line B). In FIG. 21 a peak output is calculated by the MCU at a power higher than a rated power and then various LEDs are chosen from the database until one is found where the flux output $\phi_v$ at the rated power is equal to or greater than the required power $\phi_{req}$.

As mentioned above, unlike traditional power electronic circuits, the main factor that needs to be optimized in a lighting system is the luminous efficacy instead of energy efficiency. Good luminous efficacy would automatically imply good efficacy, but not vice versa. The general (steady-state) photo-electro-thermal (PET) theory for LED systems, as described above, has pointed out both theoretically and practically that an LED device will not generate the maximum amount of luminous output at its rated power unless the LED system is optimally designed in an integrated manner. Optimal design of LED systems can only be achieved with the proper choice of LED devices and array structures, LED drivers, operating powers and thermal designs. Various aspects of LED systems such as the thermal management, non-linear behavior of junction-to-case thermal resistance, LED drivers and current sharing techniques for LED strings have been reported. While the interactions of photometric, electric and thermal aspects of the LED systems have been linked together, very limited research on the time-dependency of the luminous performance of LED systems has been reported.

This time factor is in fact highly relevant to the actual luminous output of any LED system. For LED systems designed for continuous operation, such as road lighting systems and LED bulbs, the luminous output will drop from the initial to steady-steady operation. The main reason is due to the gradual increase in the LED junction and heatsink temperature values. Therefore, the time factor is critical in understanding how much luminous reduction an LED system will have so that proper LED systems can be designed. For LED systems with momentarily or discontinuous operation, such as traffic lights and signal indicators of vehicles, the design criteria would be different from those for continuous operation.

The PET theory describes the steady-state performance of an LED system. The following is a photo-electro-thermo-temporal (PETT) theory that incorporates the time domain into the PET theory so that the dynamic behavior of the LED systems can be studied. The PETT theory can also be termed a dynamic PET theory. This PETT theory or dynamic PET theory will converge to the steady-state theory under steady-state conditions. Since the luminous efficacy is the main design factor for LED systems, this dynamic theory provides a useful tool not only for studying the behavior of LED systems, but more importantly, for optimizing LED system designs for both continuous and discontinuous operations.

As a special application of this PETT theory, the dynamic variation of the junction temperature can be predicted accurately. This theory therefore provides a valuable numerical design tool for LED systems.

In the following description of the PETT theory, the symbols and labels for various quantities and terms in formulae refer primarily to those quantities and terms under the described PETT theory. However, it will be appreciated that some of the symbols and labels refer to equivalent quantities and terms under the PET theory described above. Furthermore, where a formula under the PETT theory has an equivalent formula under the PET theory described above, the reference numeral of the equivalent formula under the PET theory appears in square brackets "[ ]" and in italics after the reference numeral of the formula under the PETT theory, so that the equivalent formulae can be easily compared.

Figure 23:
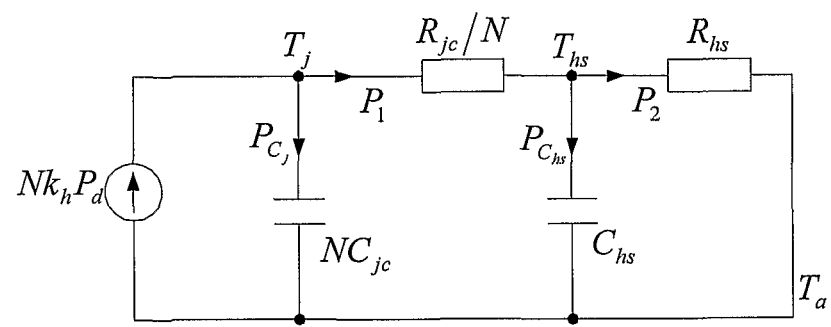
FIG. 23 shows another simplified thermal equivalent circuit of N LEDs mounted on a heatsink.

FIG. 23 shows a simplified thermal equivalent circuit of N LEDs mounted on a heatsink. The heat source $P_{heat}$ is the amount of heat generated by the LED. The internal junction temperature of the LED device is $T_j$. The thermal resistor and thermal capacitor of the power device are labeled as $R_{jc}$ and $C_{jc}$ respectively. $T_{hs}$ is heatsink surface temperature, $R_{hs}$ and $C_{hs}$ are heatsink thermal resistor and thermal capacitor respectively. In practice, the LED packages are mounted on the heatsink with some form of electrical insulation or with the use of thermal paste to ensure good thermal contact. The thermal resistance of this thermally conductive layer is usually much smaller than $R_{jc}$ and $R_{hs}$ and is thus ignored in the following analysis.

The amount of heat generated by an LED can be expressed as:

$$P_{heat} = k_h P_d \quad (T1)$$

where $k_h$ is the heat dissipation coefficient that represents the portion of input power that is dissipated as heat and $P_d$ is the input power of each LED.

In FIG. 23, some heat ($P_1$) flows from the equivalent heat source through the equivalent thermal resistor, and another portion of the heat ($P_{Cj}$) flows into the equivalent thermal capacitor of the LED package. Based on the circuit analysis technique, it can be shown that:

$$P_{C_j} = N k_h P_d - P_1 \quad (T2)$$

$$P_{C_j} = N C_{jc} \frac{d(T_j - T_a)}{dt} \quad (T3)$$

$$P_1 = \frac{T_j - T_{hs}}{R_{jc}/N} \quad (T4)$$

Based on (T2), (T3) and (T4), $$NC_{jc}\frac{d(T_j - T_a)}{dt} = Nk_hP_d - \frac{T_j - T_{hs}}{R_{jc}/N} \quad (T5)$$

Rearranging (T5) gives $$\frac{dT_j}{dt} + \frac{1}{C_{jc}R_{jc}}T_j = \frac{k_hP_d}{C_{jc}} + \frac{T_{hs}}{C_{jc}R_{jc}} \quad (T6)$$

In reality, both of the junction temperature and the heatsink temperature will change with time under normal operation. In practice, the thermal time constant of the LED package ($\tau_{jc} = R_{jc}C_{jc}$ which is typically tens of seconds) is much smaller than that of the heatsink ($\tau_{hs} = R_{hs}C_{hs}$ which is typically hundreds of seconds). The heatsink temperature $T_{hs}$ will change much slowly than LED junction temperature $T_j$. In order to avoid confusion, the terms 'fast transient' and 'slow transient' refer to the time frames in the order of the $\tau_{jc}$ and $\tau_{hs}$, respectively. Under fast transient situation, $T_{hs}$ can be considered as a constant. Based on this argument, the dynamic relationship between $T_j$ and $T_{hs}$ under the fast transient condition can be obtained from (T6) as:

[cf. (5a)]

$$T_j = R_{jc}k_hP_d\left(1 - e^{-\frac{t}{C_{jc}R_{jc}}}\right) + T_{hs} \quad (T7)$$

For the heatsink, heat flows into the thermal capacitor $C_{hs}$ and the thermal resistor $R_{hs}$ of the heatsink. The heat flow component $P_1$ can be expressed as:

$$P_1 = P_{C_{hs}} + P_2 \quad (T8)$$

where $P_{C_{hs}}$ is the heat flowing into the thermal capacitor of heatsink, and $P_2$ is the heat through the thermal resistor of the heatsink. They can be formulated as:

$$P_{C_{hs}} = C_{hs}\frac{d(T_{hs} - T_a)}{dt} \quad (T9)$$

$$P_2 = \frac{T_{hs} - T_a}{R_{hs}} \quad (T10)$$

From (T4), (T8), (T9) and (T10), the heatsink temperature is therefore:

$$\frac{T_j - T_{hs}}{R_{jc}/N} = C_{hs}\frac{d(T_{hs} - T_a)}{dt} + \frac{T_{hs} - T_a}{R_{hs}} \quad (T11)$$

which can be rewritten as:

$$\frac{dT_{hs}}{dt} = \frac{N}{C_{hs}R_{jc}}T_j - \frac{NR_{hs} + R_{jc}}{C_{hs}R_{hs}R_{jc}}T_{hs} + \frac{T_a}{C_{hs}R_{hs}} \quad (T12)$$

Now, the relationship of $T_j$ and $T_{hs}$ obtained in (T7) can be used in (T12):

$$\frac{dT_{hs}}{dt} = \frac{N}{C_{hs}R_{jc}}\left(-R_{jc}k_hP_d e^{-\frac{t}{C_{jc}R_{jc}}} + R_{jc}k_hP_d + T_{hs}\right) - \quad (T13)$$

$$\frac{NR_{hs} + R_{jc}}{C_{hs}R_{hs}R_{jc}}T_{hs} + \frac{T_a}{C_{hs}R_{hs}}$$

Solving equation (T13), the heatsink temperature $T_{hs}$ can be obtained as:

$$T_{hs}(t) = \frac{-R_{jc}C_{jc}NR_{hs}k_hP_d}{C_{jc}R_{jc} - C_{hs}R_{hs}}e^{-\frac{t}{C_{jc}R_{jc}}} + NR_{hs}k_hP_d + Ae^{-\frac{t}{C_{hs}R_{hs}}} + T_a \quad (T14)$$

where A represents a constant, which can be determined from the physical boundary condition of the heatsink. The boundary condition of a heatsink is that at t=0 the heatsink temperature is equal to ambient temperature. That is, $$T_{hs}(t=0) = T_a \quad (T15)$$

Putting (T15) into (T14), the coefficient A can be obtained as:

$$A = -\left(\frac{-R_{jc}C_{jc}NR_{hs}k_hP_d}{C_{jc}R_{jc} - C_{hs}R_{hs}} + NR_{hs}k_hP_d\right)$$

Putting A into equation (T13), the heatsink temperature can be obtained as:

[cf. (4)]

$$T_{hs}(t) = \frac{-R_{jc}C_{jc}NR_{hs}k_hP_d}{C_{jc}R_{jc} - C_{hs}R_{hs}}e^{-\frac{t}{C_{jc}R_{jc}}} - \quad (T16)$$

$$k_hP_d\left(\frac{-NR_{hs}R_{jc}C_{jc}}{C_{jc}R_{jc} - C_{hs}R_{hs}} + NR_{hs}\right)e^{-\frac{t}{C_{hs}R_{hs}}} + NR_{hs}k_hP_d + T_a$$

By putting the result of (T16) into (T7), the complete dynamic relationship of $T_j$ and $T_{hs}$ is:

[cf. (5b)]

$$T_j = \left\{-R_{jc}k_hP_d\left(\frac{C_{jc}NR_{hs}}{C_{jc}R_{jc} - C_{hs}R_{hs}} + 1\right)e^{-\frac{t}{C_{jc}R_{jc}}} - \quad (T17)\right.$$

$$k_hP_d\left(\frac{-NR_{hs}R_{jc}C_{jc}}{C_{jc}R_{jc} - C_{hs}R_{hs}} + NR_{hs}\right)e^{-\frac{t}{C_{hs}R_{hs}}} +$$

$$\left.(R_{jc} + NR_{hs})k_hP_d + T_a\right\}$$

The luminous efficacy (E) has the following relationship with the junction temperature $T_j$ of the LED.

$$E = E_o[1 + k_e(T_j - T_o)] \quad (T18)$$

Now, $T_j$ obtained in (T17) can be used in (T18):

[cf. (6)]

$$E = E_o\left[1 + k_e(T_a - T_o) + k_e k_h(R_{jc} + NR_{hs})P_d - k_e R_{jc} k_h P_d\left(\frac{NR_{hs}C_{jc}}{C_{jc}R_{jc} - C_{hs}R_{hs}} + 1\right)e^{-\frac{t}{C_{jc}R_{jc}}} - k_e k_h P_d\left(\frac{-R_{jc}C_{jc}NR_{hs}}{C_{jc}R_{jc} - C_{hs}R_{hs}} + NR_{hs}\right)e^{-\frac{t}{C_{hs}R_{hs}}}\right] \quad (T19)$$

So the total luminous flux $\phi_v$ is

[cf. (7b)]

$$\phi_v = NEP_d \quad (T20)$$

$$\phi_v = NE\left\{\begin{array}{l}[1 + k_e(T_a - T_o)]P_d + k_e k_h(R_{jc} + NR_{hs})P_d^2 - \\ k_e k_h R_{jc}\left(\frac{NR_{hs}C_{jc}}{C_{jc}R_{jc} - C_{hs}R_{hs}} + 1\right)e^{-\frac{t}{C_{jc}R_{jc}}}P_d^2 - \\ k_e k_h\left(\frac{-R_{jc}C_{jc}NR_{hs}}{C_{jc}R_{jc} - C_{hs}R_{hs}} + NR_{hs}\right)e^{-\frac{t}{C_{hs}R_{hs}}}P_d^2\end{array}\right\}$$

Equations (T16) to (T20) now form the dynamic equations that describe the essential variables of the LED system. These dynamic equations can converge to the steady-state equations as time variable t approaches infinity. As $t \to \infty$:
eqn.(T16) becomes $$T_{hs}(t) = NR_{hs}k_h P_d + T_a \quad (T21)[cf.(4)]$$

eqn.(T17) becomes $$T_j = (R_{jc} + NR_{hs})k_h P_d + T_a \quad (T22)[cf.(5b)]$$

eqn.(T19) becomes $$E = E_o[1 + k_e(T_a - T_o) + k_e k_h(R_{jc} + NR_{hs})P_d] \quad (T23)[cf.(6)]$$

eqn.(T20) becomes $$\phi_v = NE\{[1 + k_e(T_a - T_o)]P_d + k_e k_h(R_{jc} + NR_{hs})P_d^2\} \quad (T24)[cf.(7b)]$$

It can be seen that (T21), (T22), (T23) and (T24) are identical to the steady-state equations of the general PET theory described previously (the reference numerals of the equivalent equations of the PET theory are shown in square brackets and italics directly after the reference numerals of these PETT equations).

Because the thermal time constant of the LED device package is typically in the order to tens of seconds (and that of the heatsink is typically tens of minutes), the junction temperature of the LED does not change significantly within tens of micro-seconds. Therefore, it can be assumed that the junction temperature remains constant if the time frame is small compared with the thermal time constant of the LED device package. For example, for an off-line LED system powered by the ac mains, the mains frequency is either 50 Hz or 60 Hz. So the period of the mains half cycle is typically 10 ms or 8.33 ms which is small compared with the time constant of the LED package of tens of seconds. Thus, the steady-state equation (T24) can be rewritten as:

$$R_{jc} = \frac{\phi_v}{NE_o k_e k_h}P_d^{-2} - \frac{1 + k_e(T_a - T_o)}{k_e k_h}P_d^{-1} - NR_{hs} \text{ for } P_d > 0 \quad (T25)$$

It is important to note that $R_{jc}$ in (T25) can be determined from the measured LED power $P_d$ and luminous flux $\phi_v$ and other measurable coefficients, heatsink temperature and temperature. With this $R_{jc}$ obtained, the dynamic junction temperature can be obtained from (T17):

$$T_j = \left\{-R_{jc}k_h P_d\left(\frac{C_{jc}NR_{hs}}{C_{jc}R_{jc} - C_{hs}R_{hs}} + 1\right)e^{-\frac{t}{C_{jc}R_{jc}}} - k_h P_d\left(\frac{-NR_{hs}R_{jc}C_{jc}}{C_{jc}R_{jc} - C_{hs}R_{hs}} + NR_{hs}\right)e^{-\frac{t}{C_{hs}R_{hs}}} + (R_{jc} + NR_{hs})k_h P_d + T_a\right\} \quad (T17)$$

For the steady-state conditions, eqn.(T17) becomes $$T_j = (R_{jc} + NR_{hs})k_h P_d + T_a \quad (T22)$$

The equations of the dynamic model described above can form the basis of numerical design tools and methods as follows.

Figure 24:
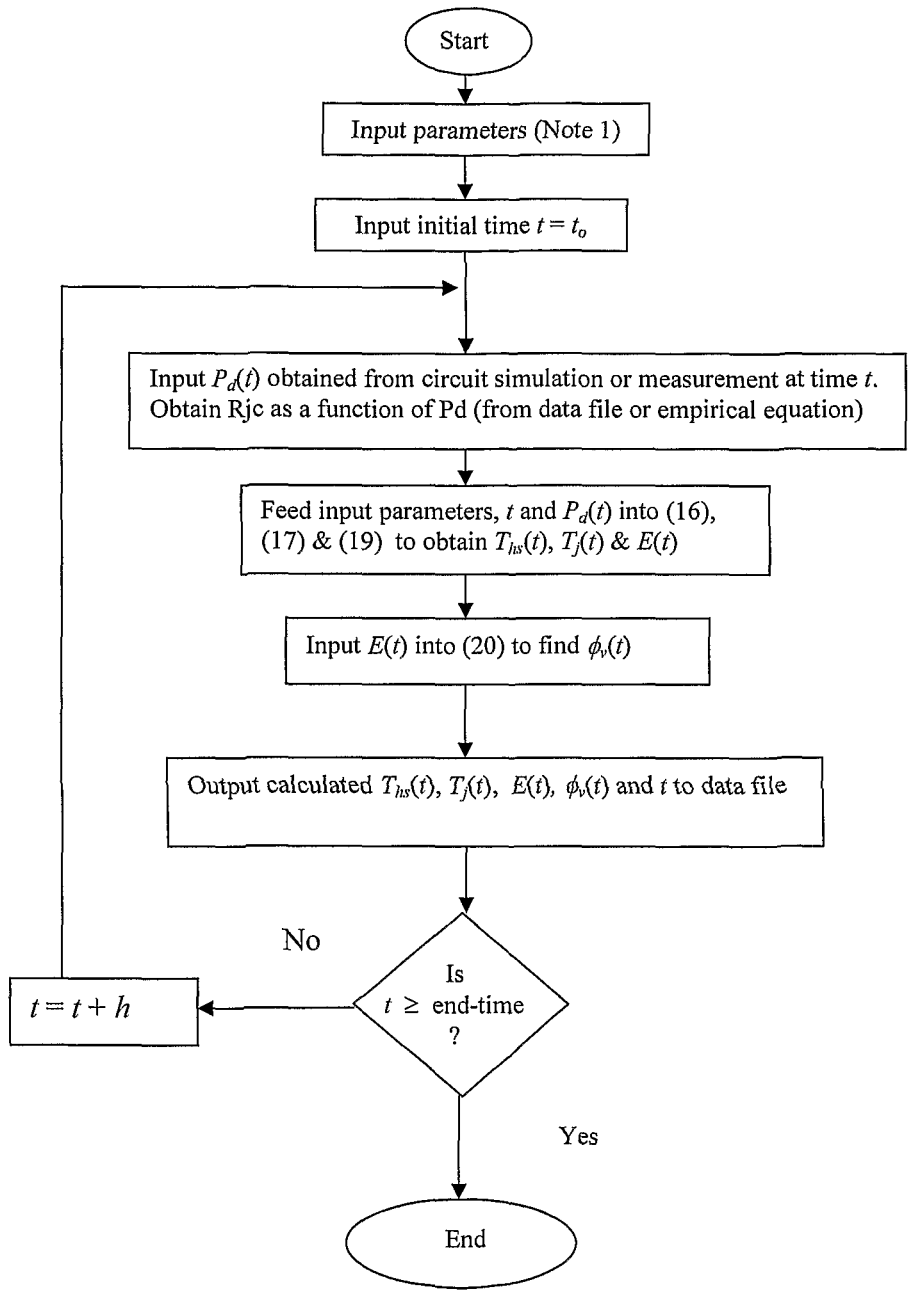
FIG. 24 shows a flowchart illustrating the use of another embodiment of the invention.

Provided the junction thermal resistance is known or approximated, the flowchart of FIG. 24 shows an example of using the above dynamic model in a numerical design tool or a method to determine:
(i) the luminous flux;
(ii) the luminous efficacy;
(iii) the heatsink temperature; or
(iv) the LED junction temperature.

This approach gives a good estimation of the luminous performance and can thus be used iteratively to fine tune LED system designs.

Figure 25:
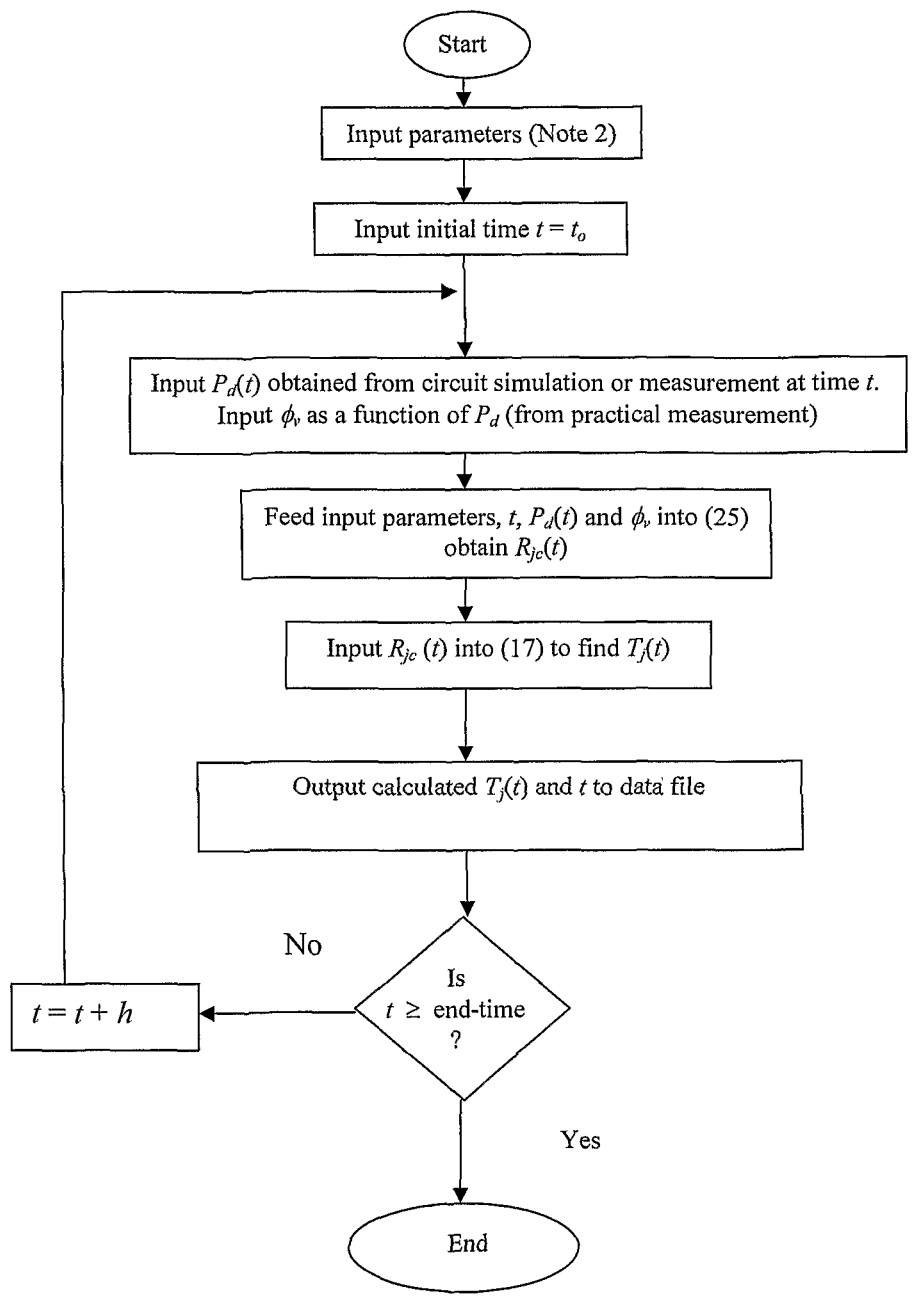
FIG. 25 shows a flowchart illustrating the use of a further embodiment of the invention.

Further important embodiments of a numerical design tool and a method provide data on the junction temperature in a practical LED system in order to make sure that the junction temperature will not exceed the maximum temperature limits as specified in the LED device data sheets. FIG. 25 shows a flowchart of an embodiment of a prediction method or a numerical design tool based on practical measurements of the luminous flux and LED power. If the peak junction temperature exceeds the maximum limit, then the design should be modified.

Thus, the dynamic model described above can be embodied as numerical tools and methods, or form part of numerical tools and methods. Preferably, these numerical tools and methods are implemented, or partly implemented, on a computer. These computer-implemented numerical tools and methods can be in the form of a software tool, or can involve the use of a software tool. In some embodiments, the computer-implemented numerical tools, or the computer-implemented parts of the methods, are accessible from an internet website. In another embodiment, the computer-implemented numerical tools, or the computer-implemented parts of the methods, are stored on a portable computer-readable medium, such as a CD, DVD, or a flash memory device. These can then be sold separately for implementation on a user's computer.

Tests were carried out as practical confirmation of the accuracy of the numerical tools described above.
(i) Tests on CREE X Lamp XR-E 3W LEDs Eight CREE 3W LEDs were mounted on heatsinks in two sets of tests with the heatsink thermal resistance equal to 1.8° C./W (Sample A) and 2.9° C./W (Sample B). Instead of using the constant $R_{jc}$ value in the LED data sheet, the curves formed by the calculated $R_{jc}$ values based on (T25) are used for predicting relationships of the luminous flux and LED power at different time intervals. Table 1 below shows the measured data and the corresponding calculated $R_{jc}$ values when the two heatsinks are used.

TABLE 1

Parameter list for the calculation of $R_{jc}$ of CREE X lamp XR-E LEDs mounted on heatsinks with thermal resistances of 1.8° C./W and 2.9° C./W.

| Heatsink with 1.8° C./W thermal resistance | Power(watt) | 1.94 | 2.27 | 2.65 | 3.00 | 3.36 | 3.73 | 4.10 |
|---|---|---|---|---|---|---|---|---|
| | Luminous flux (lumen) | 1247 | 1367 | 1476 | 1546 | 1617 | 1674 | 1711 |
| | Calculated $R_{jc}$ (° C./W) | 9.4 | 17.5 | 23.4 | 28.1 | 29.9 | 31.1 | 31.8 |
| Heatsink with 2.9° C./W thermal resistance | Power(watt) | 1.91 | 2.26 | 2.60 | 2.96 | 3.31 | 3.67 | 4.02 |
| | Luminous flux (lumen) | 1184 | 1294 | 1384 | 1443 | 1490 | 1521 | 1533 |
| | Calculated $R_{jc}$ (° C./W) | 10.4 | 18.5 | 23.6 | 28.0 | 30.1 | 31.3 | 32.1 |

Figure 26:
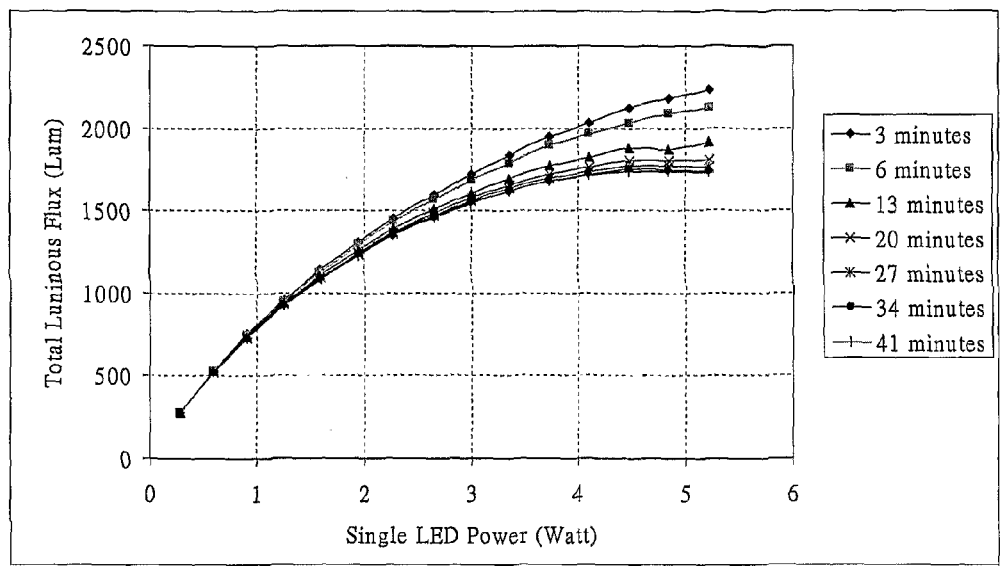
FIG. 26 shows a chart of the measured luminous flux for an LED system having eight LEDs mounted on a heatsink with thermal resistance of 1.8° C./W.
Figure 27:
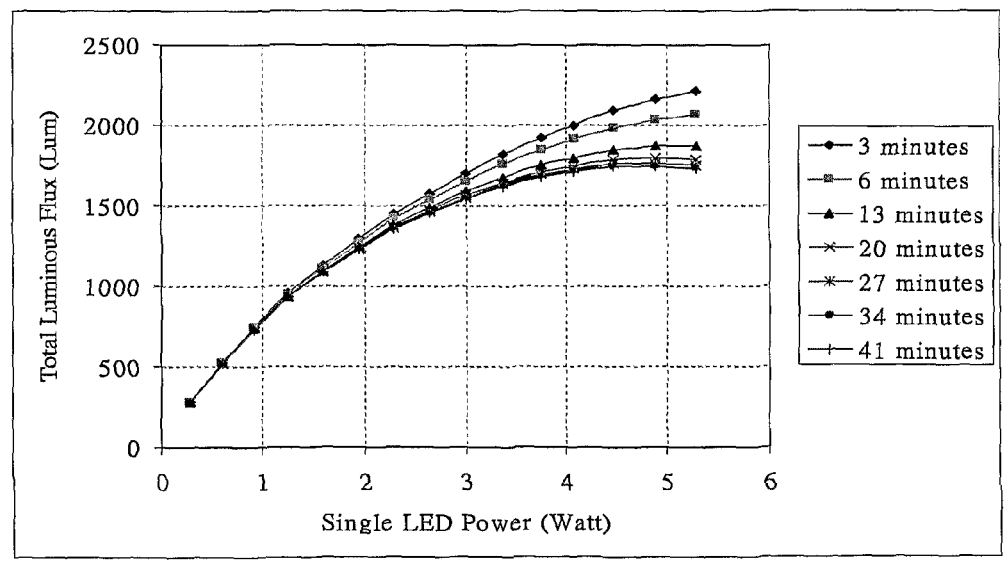
FIG. 27 shows a chart of the calculated luminous flux for the LED system referred to in FIG. 26, the luminous flux calculated in accordance with an embodiment of the invention.

(a) On a Heatsink with Thermal Resistance of 1.8° C./W:

The curves of the luminous flux are measured and recorded at different time intervals as shown in FIG. 26. The parameters $\tau_{LED}=C_{jc}R_{jc}$, $\tau_{hs}=C_{hs}R_{hs}$, $R_{hs}$ and $R_{jc}$ are listed in Table 2 below. Based on the dynamic theory (PETT), the theoretical curves of the luminous flux obtained from (T20) at the same time intervals are plotted in FIG. 27.

TABLE 2

LED system parameters.

| $k_e$ | $k_h$ | $E_o$ | $T_a$ | $T_o$ | N | $R_{hs}$ | $\tau_{LED} = C_{jc}R_{jc}$ | $\tau_{hs} = C_{hs}R_{hs}$ |
|---|---|---|---|---|---|---|---|---|
| −0.0025 | 0.87 | 90 | 28 | 25 | 8 | 1.8 | 45 | 520 |

Figure 28:
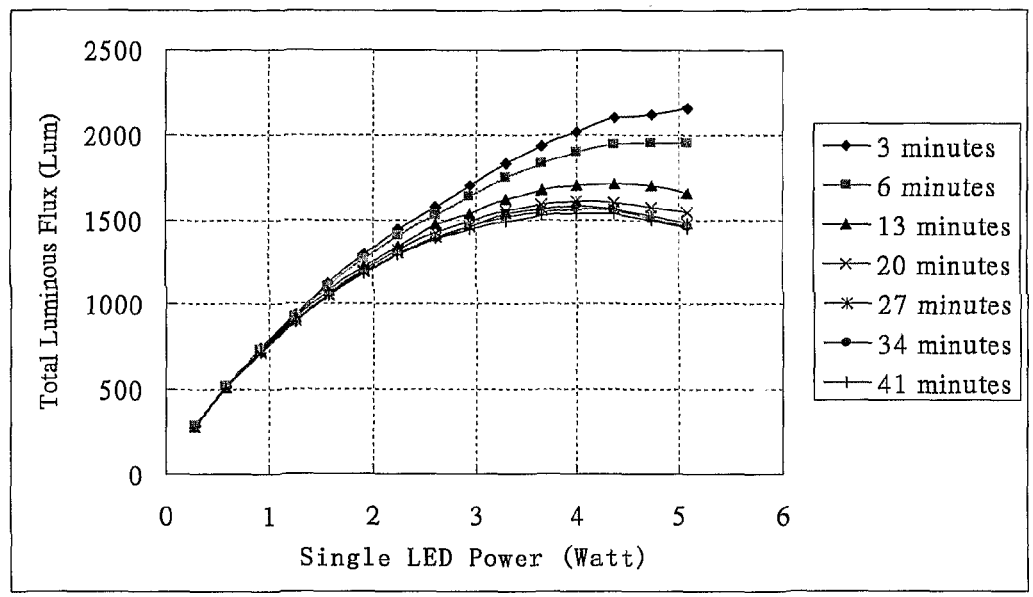
FIG. 28 shows a chart of the measured luminous flux for an LED system having eight LEDs mounted on a heatsink with thermal resistance of 2.9° C./W.
Figure 29:
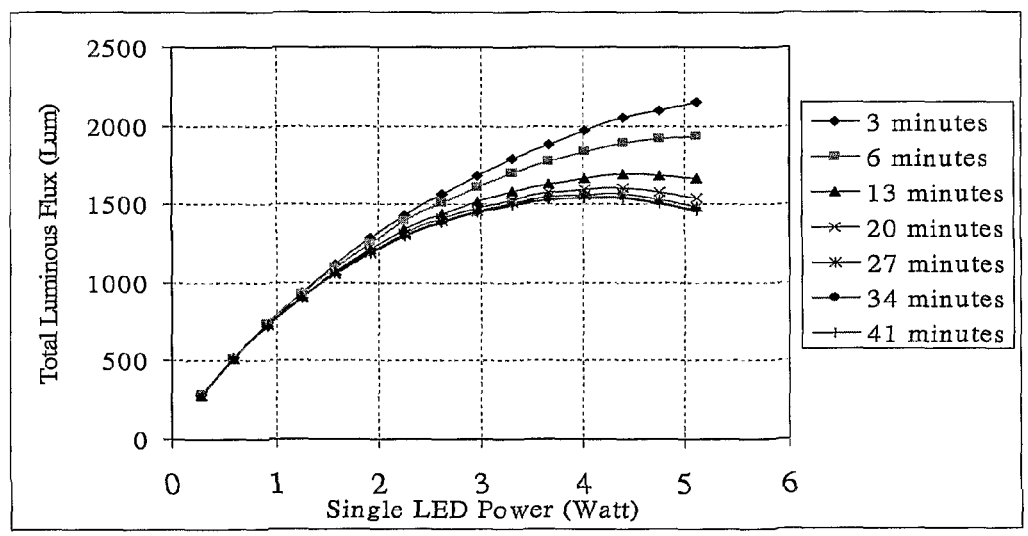
FIG. 29 shows a chart of the calculated luminous flux for the LED system referred to in FIG. 28, the luminous flux calculated in accordance with an embodiment of the invention.

(b) On a Heatsink with Thermal Resistance of 2.9° C./W:

The measured luminous flux curves are shown in FIG. 28. For the theoretical curves, the parameters $\tau_{LED}=C_{jc}R_{jc}$, $\tau_{hs}=C_{hs}R_{hs}$ and $R_{hs}$ are listed in Table 3 below. The theoretical luminous flux curves versus LED power at different time intervals generated by (T20) are plotted in FIG. 29. Very good agreements between the measured and theoretical curves are observed.

TABLE 3

LED system parameters.

| $k_e$ | $k_h$ | $E_o$ | $T_a$ | $T_o$ | N | $R_{hs}$ | $\tau_{LED} = C_{jc}R_{jc}$ | $\tau_{hs} = C_{hs}R_{hs}$ |
|---|---|---|---|---|---|---|---|---|
| −0.0025 | 0.87 | 90 | 28 | 25 | 8 | 2.9 | 45 | 510 |

Figure 30:
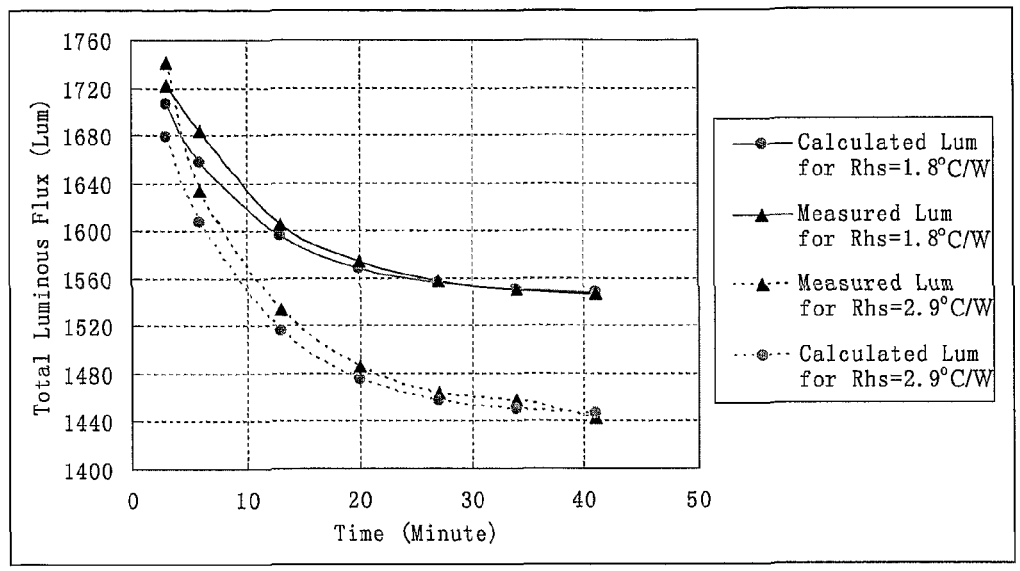
FIG. 30 shows a chart depicting the variation with time of the measured and calculated luminous flux for the two LED systems referred to in FIGS. 26 and 28.

Based on (T20), the measured and calculated luminous flux versus time curves of the two examples above are plotted in FIG. 30. These results confirm the accuracy of the method and numerical tool for forming and optimizing the performance of LED systems as proposed in the present invention.

(ii) Off-Line LED Bulb

In another example, an off-line LED bulb (with an electronic LED driver and LED devices) mounted on a heatsink with thermal resistance of 4.1° C./W is simulated. In the simulation, $R_{jc}$ is determined from equation (T25) using the practical luminous flux measurements. The variations of the junction temperature are predicted and recorded at different intervals (from 2 minutes to 27 minutes) after the LED bulb is turned on.

Figure 31:
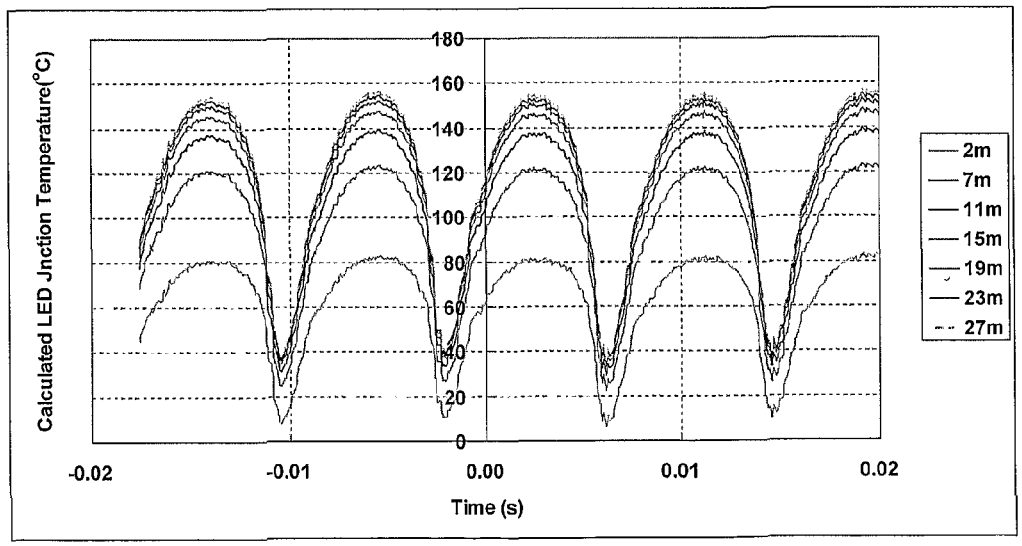
FIG. 31 shows a chart of the junction temperature over time of an offline LED mounted on a heatsink with thermal resistance of 4.1° C./W, the junction temperature calculated in accordance with an embodiment of the invention.

These junction temperature curves are plotted in FIG. 31. It is clear that this numerical tool can predict the gradual increase in junction temperature (due to the gradual temperature increase in the heatsink which has a longer thermal time constant of tens of minutes). From FIG. 31, it is important to note that, under steady-state conditions, the peak junction temperature exceeds 150° C., which is the maximum temperature of many LED devices. Such operation will definitely reduce the lifetime of the LED product. Therefore, this numerical tool allows the product designer to predict this important factor.

Figure 32:
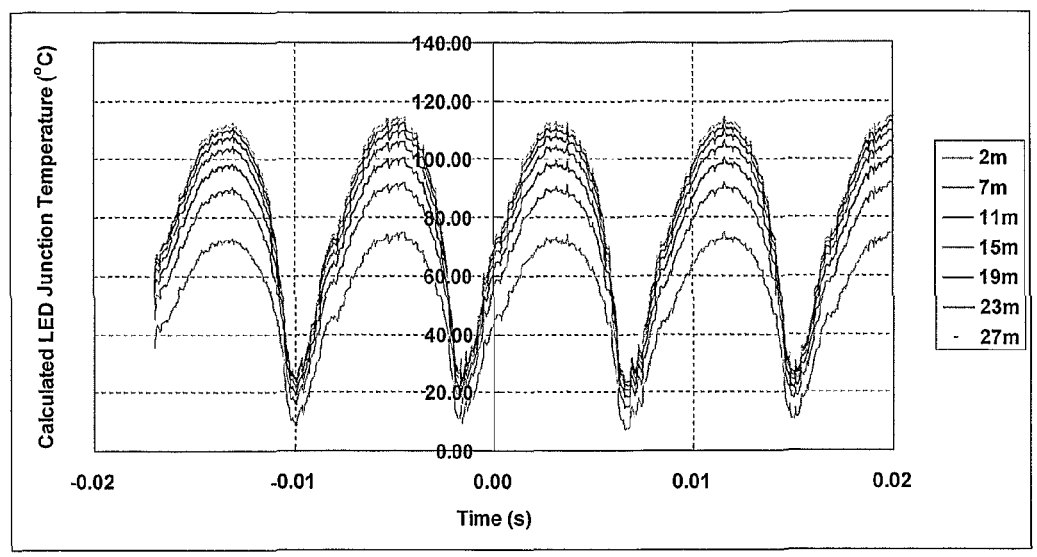
FIG. 32 shows a chart of the junction temperature over time of an offline LED mounted on a heatsink with thermal resistance of 2.2° C./W, the junction temperature calculated in accordance with an embodiment of the invention.

Now the heatsink with thermal resistance of 4.1° C./W is replaced by a large heatsink with thermal resistance of 2.2° C./W and the corresponding junction temperature curves are plotted in FIG. 32. It can be seen that the peak junction temperature now falls below the maximum temperature of 150° C. and therefore the product will be more reliable.

The internal junction temperature of LED packages cannot be easily assessed directly. In LED system design, it is important to make sure that the junction temperature of an LED does not exceed its maximum rating in order to prolong its lifetime. As shown above, the present invention offers a method and a numerical tool that can be used to predict the junction temperature in a computer simulation or other computational environment. It can be used as a design tool for LED systems.

Although the invention has been described with reference to specific examples, it will be appreciated by those skilled in the art that the invention can be embodied in many other forms. It will also be appreciated by those skilled in the art that the features of the various examples described can be combined in other combinations.

The invention claimed is:

1. A method of forming or optimizing an LED system to achieve a luminous performance over a time period, the LED system comprising a single or a plurality of LEDs on a heatsink with each LED having a junction, the method comprising the steps of:
   (a) calculating a predicted luminous performance over the time period with a computer-implemented dynamic model; and
   (b) modifying the LED system such that the predicted luminous performance matches the luminous performance, wherein luminous performance is one or more of luminous flux of the LED system, luminous efficacy of the LED system, heatsink temperature and junction temperature over the time period.

2. A method according to claim 1 wherein the computer-implemented dynamic model comprises the following equations for calculating the luminous flux of the LED system, the luminous efficacy of the LED system, the heatsink temperature and the junction temperature over the time period:

$$T_{hs}(t) = \frac{-R_{jc}C_{jc}NR_{hs}k_hP_d}{C_{jc}R_{jc} - C_{hs}R_{hs}}e^{-\frac{t}{C_{jc}R_{jc}}} -$$

$$k_hP_d\left(\frac{-NR_{hs}R_{jc}C_{jc}}{C_{jc}R_{jc} - C_{hs}R_{hs}} + NR_{hs}\right)e^{-\frac{t}{C_{hs}R_{hs}}} + NR_{hs}k_hP_d + T_a$$

$$T_j = \begin{cases} -R_{jc}k_hP_d\left(\frac{C_{jc}NR_{hs}}{C_{jc}R_{jc} - C_{hs}R_{hs}} + 1\right)e^{-\frac{t}{C_{jc}R_{jc}}} - \\ k_hP_d\left(\frac{-NR_{hs}R_{jc}C_{jc}}{C_{jc}R_{jc} - C_{hs}R_{hs}} + NR_{hs}\right)e^{-\frac{t}{C_{hs}R_{hs}}} + \\ (R_{jc} + NR_{hs})k_hP_d + T_a \end{cases}$$

$$E = E_o \begin{bmatrix} 1 + k_e(T_a - T_o) + k_ek_h(R_{jc} + NR_{hs})P_d - \\ k_eR_{jc}k_hP_d\left(\frac{NR_{hs}C_{jc}}{C_{jc}R_{jc} - C_{hs}R_{hs}} + 1\right)e^{-\frac{t}{C_{jc}R_{jc}}} - \\ k_ek_hP_d\left(\frac{-R_{jc}C_{jc}NR_{hs}}{C_{jc}R_{jc} - C_{hs}R_{hs}} + NR_{hs}\right)e^{-\frac{t}{C_{hs}R_{hs}}} \end{bmatrix}$$

$$\phi_v = NE \begin{cases} [1 + k_e(T_a - T_o)]P_d + k_ek_h(R_{jc} + NR_{hs})P_d^2 - \\ k_ek_hR_{jc}\left(\frac{NR_{hs}C_{jc}}{C_{jc}R_{jc} - C_{hs}R_{hs}} + 1\right)e^{-\frac{t}{C_{jc}R_{jc}}}P_d^2 - \\ k_ek_h\left(\frac{-R_{jc}C_{jc}NR_{hs}}{C_{jc}R_{jc} - C_{hs}R_{hs}} + NR_{hs}\right)e^{-\frac{t}{C_{hs}R_{hs}}}P_d^2 \end{cases}$$

wherein:
N is the number of LEDs in the LED system;
$T_j$ is the junction temperature of each LED;
$R_{jc}$ is the thermal resistance of the junction of each LED;
$C_{jc}$ is the thermal capacitance of the junction of each LED;
$T_{hs}$ is the heatsink temperature;
$R_{hs}$ is the thermal resistance of the heatsink;
$C_{hs}$ is the thermal capacitance of the heatsink;
$T_o$ is the rated temperature;
$T_a$ is the ambient temperature;
$k_h$ is the heat dissipation coefficient that represents the portion of input power that is dissipated as heat;
$P_d$ is the input power of each LED;
E is the luminous efficacy;
$E_o$ is the rated luminous efficacy at the rated temperature
$k_e$ is the relative reduction of efficacy with increase in temperature;
$\phi_v$ is the total luminous flux; and
t is time.

3. A method according to claim 1 wherein the computer-implemented dynamic model is in the form of a software tool on a computer accessible through an internet website.

4. A method according to claim 1 wherein the computer-implemented dynamic model is in the form of a software tool stored on a portable computer-readable medium.

5. A method of optimizing an LED system, the LED system comprising a single or a plurality of LEDs on a heatsink with each LED having a junction, the method comprising the steps of:
(a) calculating junction temperature over a time period with a computer-implemented dynamic mode; and
(b) modifying the LED system if a calculated peak junction temperature exceeds a maximum rated junction temperature so as to optimize the LED system;
wherein the computer-implemented dynamic model utilizes the following equation for calculating the junction temperature:

$$T_j = \begin{cases} -R_{jc}k_hP_d\left(\frac{C_{jc}NR_{hs}}{C_{jc}R_{jc} - C_{hs}R_{hs}} + 1\right)e^{-\frac{t}{C_{jc}R_{jc}}} - \\ k_hP_d\left(\frac{-NR_{hs}R_{jc}C_{jc}}{C_{jc}R_{jc} - C_{hs}R_{hs}} + NR_{hs}\right)e^{-\frac{t}{C_{hs}R_{hs}}} + (R_{jc} + NR_{hs})k_hP_d + T_a \end{cases}$$

wherein:
N is the number of LEDs in the LED system;
$T_j$ is the junction temperature of each LED;
$R_{jc}$ is the thermal resistance of the junction of each LED;
$C_{jc}$ is the thermal capacitance of the junction of each LED;
$T_{hs}$ is the heatsink temperature;
$R_{hs}$ is the thermal resistance of the heatsink;
$C_{hs}$ is the thermal capacitance of the heatsink;
$T_a$ is the ambient temperature;
$k_h$ is the heat dissipation coefficient that represents the portion of input power that is dissipated as heat
$P_d$ is the input power of each LED; and
t is time.

6. A method according to claim 1 wherein the computer-implemented dynamic model utilizes the following equation for calculating $R_{jc}$:

$$R_{jc} = \frac{\phi_v}{NE_ok_ek_h}P_d^{-2} - \frac{1 + k_e(T_a - T_o)}{k_ek_h}P_d^{-1} - NR_{hs} \text{ for } P_d > 0$$

wherein:
$T_o$ is the rated temperature;
$E_o$ is the rated luminous efficacy at the rated temperature;
$k_e$ is the relative reduction of efficacy with increase in temperature; and
$\phi_v$ is the total luminous flux.

7. A method according to claim 5 wherein the computer-implemented dynamic model is in the form of a software tool on a computer accessible through an internet website.

8. A method according to claim 5 wherein the computer-implemented dynamic model is in the form of a software tool stored on a portable computer-readable medium.

9. A non-transitory computer readable medium containing program instructions for performing the function of a computer-implemented numerical tool comprising:
computer executable code that when executed on a processor performs the following:
calculating a predicated luminous performance over a time period for an LED system comprising a single or a plurality of LEDs on a heatsink with each LED having a junction;
modifying the LED system such that the predicted luminous performance matches a luminous performance;
wherein luminous performance is one or more of luminous flux of the LED system, luminous efficacy of the LED system, heatsink temperature and junction temperature over the time period.

10. A non-transitory computer readable medium according to claim 9 wherein the computer executable code that when executed on the processor further performs the following: calculating one or more of the luminous flux of the LED system, luminous efficacy of the LED system, heatsink temperature and junction temperature over the time period using the following equations:

$$T_{hs}(t) = \frac{-R_{jc}C_{jc}NR_{hs}k_hP_d}{C_{jc}R_{jc} - C_{hs}R_{hs}}e^{-\frac{t}{C_{jc}R_{jc}}} -$$

$$k_hP_d\left(\frac{-NR_{hs}R_{jc}C_{jc}}{C_{jc}R_{jc} - C_{hs}R_{hs}} + NR_{hs}\right)e^{-\frac{t}{C_{hs}R_{hs}}} + NR_{hs}k_hP_d + T_a$$

$$T_j = \begin{Bmatrix} -R_{jc}k_hP_d\left(\frac{C_{jc}NR_{hs}}{C_{jc}R_{jc} - C_{hs}R_{hs}} + 1\right)e^{-\frac{t}{C_{jc}R_{jc}}} - \\ k_hP_d\left(\frac{-NR_{hs}R_{jc}C_{jc}}{C_{jc}R_{jc} - C_{hs}R_{hs}} + NR_{hs}\right)e^{-\frac{t}{C_{hs}R_{hs}}} + \\ (R_{jc} + NR_{hs})k_hP_d + T_a \end{Bmatrix}$$

$$E = E_o\begin{bmatrix} 1 + k_e(T_a - T_o) + k_ek_h(R_{jc} + NR_{hs})P_d - \\ k_eR_{jc}k_hP_d\left(\frac{NR_{hs}C_{jc}}{C_{jc}R_{jc} - C_{hs}R_{hs}} + 1\right)e^{-\frac{t}{C_{jc}R_{jc}}} - \\ k_ek_hP_d\left(\frac{-R_{jc}C_{jc}NR_{hs}}{C_{jc}R_{jc} - C_{hs}R_{hs}} + NR_{hs}\right)e^{-\frac{t}{C_{hs}R_{hs}}} \end{bmatrix}$$

$$\phi_v = NE\begin{Bmatrix} [1 + k_e(T_a - T_o)]P_d + k_ek_h(R_{jc} + NR_{hs})P_d^2 - \\ k_eR_{jc}k_hP_d\left(\frac{NR_{hs}C_{jc}}{C_{jc}R_{jc} - C_{hs}R_{hs}} + 1\right)e^{-\frac{t}{C_{jc}R_{jc}}}P_d^2 - \\ k_ek_h\left(\frac{-R_{jc}C_{jc}NR_{hs}}{C_{jc}R_{jc} - C_{hs}R_{hs}} + NR_{hs}\right)e^{-\frac{t}{C_{hs}R_{hs}}}P_d^2 \end{Bmatrix}$$

wherein:
N is the number of LEDs in the LED system;
$T_j$ is the junction temperature of each LED;
$R_{jc}$ is the thermal resistance of the junction of each LED;
$C_{jc}$ is the thermal capacitance of the junction of each LED;
$T_{hs}$ is the heatsink temperature;
$R_{hs}$ is the thermal resistance of the heatsink;
$C_{hs}$ is the thermal capacitance of the heatsink;
$T_o$ is the rated temperature;
$T_a$ is the ambient temperature;
$k_h$ is the heat dissipation coefficient that represents the portion of input power that is dissipated as heat;
$P_d$ is the input power of each LED;
E is the luminous efficacy;
$E_o$ is the rated luminous efficacy at the rated temperature
$k_e$ is the relative reduction of efficacy with increase in temperature;
$\phi_v$ is the total luminous flux; and
t is time.

11. A non-transitory computer readable medium containing program instructions for performing the function of a computer-implemented numerical tool comprising:
computer executable code that when executed on a processor performs the following:
calculating junction temperature over a time period; and
modifying the LED system if a calculated peak junction temperature exceeds a maximum rated junction temperature so as to optimize the LED system;
wherein the computer-implemented numerical tool is arranged to calculate the junction temperature over the time period using the following equation:

$$T_j = \begin{Bmatrix} -R_{jc}k_hP_d\left(\frac{C_{jc}NR_{hs}}{C_{jc}R_{jc} - C_{hs}R_{hs}} + 1\right)e^{-\frac{t}{C_{jc}R_{jc}}} - \\ k_hP_d\left(\frac{-NR_{hs}R_{jc}C_{jc}}{C_{jc}R_{jc} - C_{hs}R_{hs}} + NR_{hs}\right)e^{-\frac{t}{C_{hs}R_{hs}}} + (R_{jc} + NR_{hs})k_hP_d + T_a \end{Bmatrix}$$

wherein:
N is the number of LEDs in the LED system;
$T_j$ is the junction temperature of each LED;
$R_{jc}$ is the thermal resistance of the junction of each LED;
$C_{jc}$ is the thermal capacitance of the junction of each LED;
$T_{hs}$ is the heatsink temperature;
$R_{hs}$ is the thermal resistance of the heatsink;
$C_{hs}$ is the thermal capacitance of the heatsink;
$T_a$ is the ambient temperature;
$k_h$ is the heat dissipation coefficient that represents the portion of input power that is dissipated as heat
$P_d$ is the input power of each LED; and
t is time.

12. A non-transitory computer readable medium according to claim 11 wherein the computer executable code that when executed on the processor further performs the following:
calculating $R_{jc}$ using the following equation:

$$R_{jc} = \frac{\phi_v}{NE_ok_ek_h}P_d^{-2} - \frac{1 + k_e(T_a - T_o)}{k_ek_h}P_d^{-1} - NR_{hs} \text{ for } P_d > 0$$

wherein:
$T_o$ is the rated temperature;
$E_o$ is the rated luminous efficacy at the rated temperature;
$k_e$ is the relative reduction of efficacy with increase in temperature; and
$\phi_v$ is the total luminous flux.

13. An LED system design optimization system comprising:
a processor:
a non-transitory computer readable storage media operably coupled with the processor, the non-transitory computer readable storage media containing computer executable instructions that when executed perform the following:
calculating a predicated luminous performance of an LED system design over a time period;
wherein the luminous performance is one or more of luminous flux of the LED system, luminous efficacy of the LED system, heatsink temperature and junction temperature over the time period;
wherein the LED system comprises a single or a plurality of LEDs on heatsink with each LED having a junction;
determining an optimization of the LED system design based on the calculation;
further modifying the LED system design based on the predicted luminous performance calculation, such that the modified LED system luminous performance matches an optimized luminous performance; and
manufacturing the LED system design based upon the optimized LED performance calculations.

14. An LED system design optimization system according to claim 13, wherein the LED system design optimization system is arranged to calculate one or more of the luminous flux of the LED system, the luminous efficacy of the LED system, the heatsink temperature and the junction temperature over the time period using the following equations:

$$T_{hs}(t) = \frac{-R_{jc}C_{jc}NR_{hs}k_hP_d}{C_{jc}R_{jc} - C_{hs}R_{hs}}e^{-\frac{t}{C_{jc}R_{jc}}} -$$

$$k_hP_d\left(\frac{-NR_{hs}R_{jc}C_{jc}}{C_{jc}R_{jc} - C_{hs}R_{hs}} + NR_{hs}\right)e^{-\frac{t}{C_{hs}R_{hs}}} + NR_{hs}k_hP_d + T_a$$

-continued $$T_j = \begin{Bmatrix} -R_{jc}k_hP_d\left(\dfrac{C_{jc}NR_{hs}}{C_{jc}R_{jc}-C_{hs}R_{hs}}+1\right)e^{-\frac{t}{C_{jc}R_{jc}}} - \\ k_hP_d\left(\dfrac{-NR_{hs}R_{jc}C_{jc}}{C_{jc}R_{jc}-C_{hs}R_{hs}}+NR_{hs}\right)e^{-\frac{t}{C_{hs}R_{hs}}} + \\ (R_{jc}+NR_{hs})k_hP_d+T_a \end{Bmatrix}$$

$$E = E_o\begin{bmatrix} 1+k_e(T_a-T_o)+k_ek_h(R_{jc}+NR_{hs})P_d - \\ k_eR_{jc}k_hP_d\left(\dfrac{NR_{hs}C_{jc}}{C_{jc}R_{jc}-C_{hs}R_{hs}}+1\right)e^{-\frac{t}{C_{jc}R_{jc}}} - \\ k_ek_hP_d\left(\dfrac{-R_{jc}C_{jc}NR_{hs}}{C_{jc}R_{jc}-C_{hs}R_{hs}}+NR_{hs}\right)e^{-\frac{t}{C_{hs}R_{hs}}} \end{bmatrix}$$

$$\phi_v = NE\begin{Bmatrix} [1+k_e(T_a-T_o)]P_d+k_ek_h(R_{jc}+NR_{hs})P_d^2 - \\ k_ek_hR_{jc}\left(\dfrac{NR_{hs}C_{jc}}{C_{jc}R_{jc}-C_{hs}R_{hs}}+1\right)e^{-\frac{t}{C_{jc}R_{jc}}}P_d^2 - \\ k_ek_h\left(\dfrac{-R_{jc}C_{jc}NR_{hs}}{C_{jc}R_{jc}-C_{hs}R_{hs}}+NR_{hs}\right)e^{-\frac{t}{C_{hs}R_{hs}}}P_d^2 \end{Bmatrix}$$

wherein:
N is the number of LEDs in the LED system;
$T_j$ is the junction temperature of each LED;
$R_{jc}$ is the thermal resistance of the junction of each LED;
$C_{jc}$ is the thermal capacitance of the junction of each LED;
$T_{hs}$ is the heatsink temperature;
$R_{hs}$ is the thermal resistance of the heatsink;
$C_{hs}$ is the thermal capacitance of the heatsink;
$T_o$ is the rated temperature;
$T_a$ is the ambient temperature;
$k_h$ is the heat dissipation coefficient that represents the portion of input power that is dissipated as heat;
$P_d$ is the input power of each LED;
E is the luminous efficacy;
$E_o$ is the rated luminous efficacy at the rated temperature
$k_e$ is the relative reduction of efficacy with increase in temperature;
$\phi_v$ is the total luminous flux; and
t is time.

15. An LED system design optimization system comprising:
a processor;
a non-transitory computer readable storage media operably coupled with the processor, the non-transitory computer readable storage media containing computer executable instructions that when executed perform the following:
calculating junction temperature over a time period: and
modifying the LED system if a calculated peak junction temperature exceeds a maximum rated junction temperature so as to optimize the LED system;
wherein the LED system design optimization system is arranged to calculate the junction temperature over the time period using the following equation:

$$T_j = \begin{Bmatrix} -R_{jc}k_hP_d\left(\dfrac{C_{jc}NR_{hs}}{C_{jc}R_{jc}-C_{hs}R_{hs}}+1\right)e^{-\frac{t}{C_{jc}R_{jc}}} - \\ k_hP_d\left(\dfrac{-NR_{hs}R_{jc}C_{jc}}{C_{jc}R_{jc}-C_{hs}R_{hs}}+NR_{hs}\right)e^{-\frac{t}{C_{hs}R_{hs}}}+(R_{jc}+NR_{hs})k_hP_d+T_a \end{Bmatrix}$$

wherein:
N is the number of LEDs in the LED system;
$T_j$ is the junction temperature of each LED;
$R_{jc}$ is the thermal resistance of the junction of each LED;
$C_{jc}$ is the thermal capacitance of the junction of each LED;
$T_{hs}$ is the heatsink temperature;
$R_{hs}$ is the thermal resistance of the heatsink;
$C_{hs}$ is the thermal capacitance of the heatsink;
$T_a$ is the ambient temperature;
$k_h$ is the heat dissipation coefficient that represents the portion of input power that is dissipated as heat;
$P_d$ is the input power of each LED; and
t is time.

16. An LED system design optimization system of claim 15, wherein the LED system design optimization system is arranged to calculate $R_{jc}$ using the following equation:

$$R_{jc} = \frac{\phi_v}{NE_ok_ek_h}P_d^{-2} - \frac{1+k_e(T_a-T_o)}{k_ek_h}P_d^{-1} - NR_{hs} \text{ for } P_d > 0$$

wherein:
$T_o$ is the rated temperature;
$E_o$ is the rated luminous efficacy at the rated temperature;
$k_e$ is the relative reduction of efficacy with increase in temperature; and
$\phi_v$ is the total luminous flux.

* * * * *